(12) United States Patent
Shah et al.

(10) Patent No.: US 9,107,292 B2
(45) Date of Patent: Aug. 11, 2015

(54) CARBON NANOSTRUCTURE-COATED FIBERS OF LOW AREAL WEIGHT AND METHODS FOR PRODUCING THE SAME

(71) Applicant: APPLIED NANOSTRUCTURED SOLUTIONS, LLC, Baltimore, MD (US)

(72) Inventors: Tushar K. Shah, Fulton, MD (US); Han Liu, Timonium, MD (US); Jess Michael Goldfinger, Columbia, MD (US); John J. Morber, Taneytown, MD (US)

(73) Assignee: Applied NanoStructured Solutions, LLC, Baltimore, MD (US)

(*) Notice: Subject to any disclaimer, the term of this patent is extended or adjusted under 35 U.S.C. 154(b) by 0 days.

(21) Appl. No.: 14/089,673

(22) Filed: Nov. 25, 2013

(65) Prior Publication Data

US 2014/0151111 A1   Jun. 5, 2014

Related U.S. Application Data

(60) Provisional application No. 61/733,302, filed on Dec. 4, 2012.

(51) Int. Cl.
*H01L 23/552* (2006.01)
*H05K 9/00* (2006.01)
(Continued)

(52) U.S. Cl.
CPC .............. *H05K 9/009* (2013.01); *H05K 1/0218* (2013.01); *H05K 1/09* (2013.01); *H05K 2201/026* (2013.01); *H05K 2201/0323* (2013.01)

(58) Field of Classification Search
CPC ................... H01L 51/0048; H01L 51/5253
USPC .................................................. 257/659–660
See application file for complete search history.

(56) References Cited

U.S. PATENT DOCUMENTS

| 7,461,970 B2 | 12/2008 | Brown |
|---|---|---|
| 2005/0074392 A1 | 4/2005 | Yang et al. |

(Continued)

FOREIGN PATENT DOCUMENTS

| WO | WO-2007/094757 | 8/2007 |
|---|---|---|
| WO | WO-2007/099975 | 9/2007 |

(Continued)

OTHER PUBLICATIONS

Thostenson, et al., "Advances in the science and technology of carbon nanotubes and their composites: a review," Composites Science and Technology, 2001, pp. 1899-1912, vol. 61.

(Continued)

*Primary Examiner* — Cuong Q Nguyen
(74) *Attorney, Agent, or Firm* — McDermott Will & Emery LLP

(57) ABSTRACT

Carbon nanostructures can convey enhanced electrical conductivity to various substrates, while maintaining a high surface area and low density per unit area. Such substrates can provide good shielding against electromagnetic radiation over a wide range of frequencies. Electrically conductive structures can include a support layer containing a plurality of fibers having apertures defined between the fibers, and a plurality of carbon nanostructures at least partially conformally coating the fibers and bridging across the apertures defined between adjacent fibers to form a continuous carbon nanostructure layer. Each carbon nanostructure can include a plurality of carbon nanotubes that are branched, crosslinked, and share common walls with one another.

11 Claims, 14 Drawing Sheets

(51) Int. Cl.
    *H05K 1/02*     (2006.01)
    *H05K 1/09*     (2006.01)

(56) References Cited

U.S. PATENT DOCUMENTS

| | | |
|---|---|---|
| 2005/0255321 A1 | 11/2005 | Zhu et al. |
| 2006/0099135 A1 | 5/2006 | Yodh et al. |
| 2007/0237959 A1 | 10/2007 | Lemaire |
| 2007/0243124 A1 | 10/2007 | Baughman et al. |
| 2007/0292622 A1 | 12/2007 | Rowley et al. |
| 2007/0298669 A1 | 12/2007 | Barrera et al. |
| 2008/0075954 A1 | 3/2008 | Wardle et al. |
| 2008/0153188 A1 | 6/2008 | Ohki et al. |
| 2008/0312349 A1 | 12/2008 | Yeager et al. |
| 2009/0017211 A1* | 1/2009 | Gruner et al. ............. 427/258 |
| 2009/0035469 A1 | 2/2009 | Sue et al. |
| 2009/0068461 A1 | 3/2009 | Reneker et al. |
| 2009/0142558 A1 | 6/2009 | Jiao et al. |
| 2009/0306270 A1 | 12/2009 | Noguchi et al. |
| 2010/0003503 A1 | 1/2010 | Seppala et al. |
| 2010/0173228 A1 | 7/2010 | Wallace et al. |
| 2011/0024694 A1 | 2/2011 | Shah et al. |
| 2011/0081770 A1 | 4/2011 | Tombler, Jr. |
| 2011/0114557 A2 | 5/2011 | Johnson et al. |
| 2011/0124483 A1 | 5/2011 | Shah et al. |
| 2011/0174519 A1 | 7/2011 | Shah et al. |
| 2011/0186775 A1 | 8/2011 | Shah et al. |
| 2011/0245384 A1 | 10/2011 | Bismarck et al. |
| 2012/0000691 A1* | 1/2012 | Shah et al. ............. 977/932 |
| 2012/0058296 A1 | 3/2012 | Shah et al. |
| 2012/0070667 A1 | 3/2012 | Malet et al. |
| 2012/0129391 A1 | 5/2012 | Van Swearingen et al. |
| 2012/0219881 A1 | 8/2012 | Sivarajan |
| 2012/0234694 A1 | 9/2012 | Vecitis et al. |
| 2013/0101495 A1 | 4/2013 | Peterson et al. |

FOREIGN PATENT DOCUMENTS

| | | |
|---|---|---|
| WO | WO-2008/000163 | 1/2008 |
| WO | WO-2008/034939 | 3/2008 |
| WO | WO-2008/110166 | 9/2008 |
| WO | WO-2009/063008 | 5/2009 |
| WO | WO-2010/144183 | 12/2010 |
| WO | WO-2011/060033 | 5/2011 |
| WO | WO-2011/141755 | 11/2011 |
| WO | WO-2011/153629 | 12/2011 |

OTHER PUBLICATIONS

Biro, et al., "Carbon nanotube Y junctions: growth and properties," Diamond and Related Matters, 2004, pp. 241-249, vol. 13.
Merriam-Webster Definition of Particle.

\* cited by examiner

CARBON NANOSTRUCTURE-COATED FIBERS OF LOW AREAL WEIGHT AND METHODS FOR PRODUCING THE SAME

CROSS-REFERENCE TO RELATED APPLICATIONS

This application claims the benefit of priority under 35 U.S.C. §119 from U.S. Provisional Patent Application 61/733,302, filed Dec. 4, 2012, which is incorporated herein by reference in its entirety.

STATEMENT REGARDING FEDERALLY SPONSORED RESEARCH OR DEVELOPMENT

Not applicable.

FIELD

The present disclosure generally relates to carbon nanostructures, and, more particularly, to the use of carbon nanostructures for shielding of electromagnetic radiation.

BACKGROUND

Conductive materials are used in a wide variety of applications including, for example, EMI shielding (including cables, structures, and enclosures), antennas, conductive wires and other conductive surfaces, current collectors, black body absorbers, thermal conductors, and the like. Due to their high conductivity values, metals are most often used for these purposes. However, the significant densities of most metals can sometimes result in structures that are too heavy for efficient use in certain situations, such as aerospace and aeronautic applications.

Carbon nanotubes (CNTs) have been proposed for use in a number of applications that can take advantage of their unique combination of chemical, mechanical, electrical, and thermal properties. Various difficulties have been widely recognized in many applications when working with individual carbon nanotubes. These difficulties can include the propensity for individual carbon nanotubes to group into bundles or ropes, as known in the art. Although there are various techniques available for de-bundling carbon nanotubes into well-separated, individual members, many of these techniques can detrimentally impact the desirable property enhancements that pristine carbon nanotubes are able to provide. In addition to the foregoing, widespread concerns have been raised regarding the environmental health and safety profile of individual carbon nanotubes due to their small size. Furthermore, the cost of producing individual carbon nanotubes may be prohibitive for the commercial viability of these entities in many instances.

Carbon nanotubes have been proposed as a replacement for metals in some applications due to their significant electrical conductivity and much lower weight. One illustrative use for carbon nanotubes that has been proposed in this regard involves electromagnetic radiation shielding applications, particularly shielding against microwave energy. However, manipulating carbon nanotubes into a conductive layer that can be suitable for shielding applications has proven challenging. Foremost, the significant propensity for individual carbon nanotubes to agglomerate with one another in ropes or bundles can make it problematic to reproducibly incorporate carbon nanotubes in a composite material or to coat a substrate with carbon nanotubes in a conductive layer having sufficient optical coverage to affect shielding of electromagnetic radiation. As used herein, the term "optical coverage" refers to the extent to which a material blocks the leakage of electromagnetic radiation therethrough. Moreover, for coating applications, the small size of individual carbon nanotubes can make it problematic to directly apply the carbon nanotubes to porous substrates due to their propensity to pass through the pores defined therein, rather than residing on the substrate surface as a coating. Similar difficulties can be encountered with other conductive nanomaterials such as nanoparticles and graphene, for example.

In view of the foregoing, production of carbon nanotubes in a form that renders them more amenable for coating applications would be highly desirable, particularly for purposes of conveying electromagnetic radiation shielding. The present disclosure satisfies the foregoing needs and provides related advantages as well.

SUMMARY

In some embodiments, the present disclosure provides electrically conductive structures formed from carbon nanostructures. In some embodiments, the electrically conductive structures contain a support layer containing a plurality of fibers having apertures defined between the fibers, and a plurality of carbon nanostructures at least partially conformally coating the fibers and bridging across the apertures defined between adjacent fibers to form a continuous carbon nanostructure layer. Each carbon nanostructure contains a plurality of carbon nanotubes that are branched, crosslinked, and share common walls with one another.

In some embodiments, the present disclosure provides methods for forming carbon nanostructure layers. In some embodiments, the methods include providing a mixture containing a solvent and a plurality of carbon nanostructures, dispersing the carbon nanostructures in the solvent until the carbon nanostructures are substantially non-agglomerated, and passing the solvent through a support layer containing a plurality of fibers having apertures defined between the fibers, whereby the carbon nanostructures become at least partially conformally coated around the fibers and bridge across the apertures defined between adjacent fibers to form a continuous carbon nanostructure layer. Each carbon nanostructure contains a plurality of carbon nanotubes that are branched, crosslinked, and share common walls with one another.

In some embodiments, the present disclosure provides methods including forming a mixture containing a plurality of carbon nanostructures and a plurality of chopped fibers in a solvent, and filtering the mixture to collect the chopped fibers and carbon nanostructures as a layer structure in which the carbon nanostructures at least partially conformally coat the fibers and bridge across apertures defined between adjacent fibers. Each carbon nanostructure contains a plurality of carbon nanotubes that are branched, crosslinked, and share common walls with one another.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figures 1A, 1B, 1C:
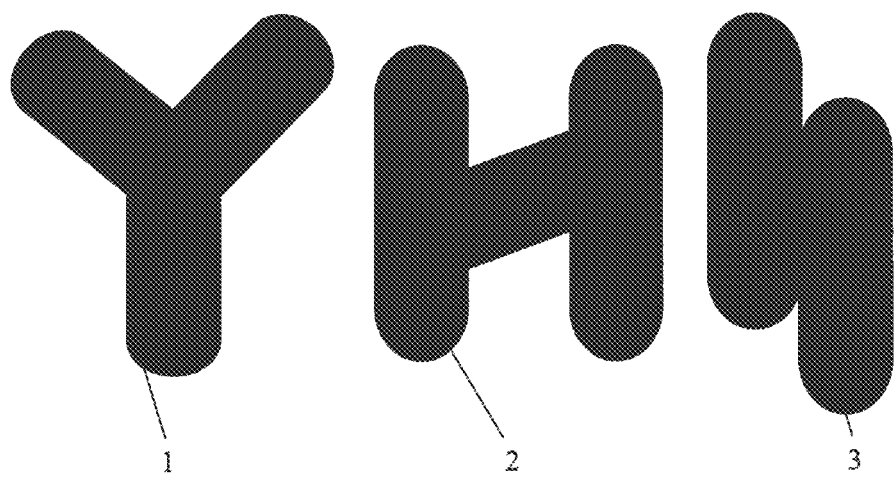
FIGS. 1A-1C show illustrative depictions of carbon nanotubes that are branched, crosslinked, and share common walls, respectively.

The present disclosure is directed, in part, to electrically conductive structures containing carbon nanostructures. The present disclosure is also directed, in part, to methods for making electrically conductive structures containing carbon nanostructures. The present disclosure is also directed, in part, to methods for shielding various articles against electromagnetic radiation using carbon nanostructures.

Although metals usually exhibit high electrical conductivity values, the weight and cost of metals can be prohibitive in many applications. Particularly in electromagnetic radiation shielding applications, these limitations can be significant in many industries. Moreover, for shielding applications, it can sometimes be difficult to form metal coatings on articles of certain geometries and/or compositions in order to convey electromagnetic radiation shielding thereto.

As an alternative to metal monoliths and metal coatings, low areal weight fiber mats containing conductive fibers can be used to convey electromagnetic radiation shielding to various structures. Such fiber mats will also be referred to synonymously herein as "veils," "fiber veils" or "veil structures." Fiber veils can be light weight and have good flexibility, thereby allowing them to be adhered as a conformal applique to various surfaces as a conductive coating. Non-surface configurations are also possible. Although fiber veils can be readily applied to many structures, the electrical conductivity of the fibers can be somewhat limited, even when the fibers are coated with a metallization layer. Moreover, apertures defined between the individual fibers represent areas of lower or non-existent electromagnetic radiation shielding, which can be unacceptable for some uses.

Table 1 shows the electromagnetic radiation shielding effectiveness of several illustrative fiber veils in comparison to that obtained from a carbon nanotube tape.

TABLE 1

| Material | Thickness (µm) | Areal weight (g/m$^2$) | Shielding Effectiveness at 4 GHz (dB) |
| --- | --- | --- | --- |
| Ripstop NiCu Polyester Fabric | 80 | 90 | 80 |
| Taffeta NiCu Nylon Fabric | 125 | 80 | 50 |
| Exfoliated Graphite Sheet | 150 | 80 | 70 |
| Al/Mylar Foil | 50 | 100 | 90 |
| Woven NiCu Carbon Fiber Veil | 290 | 175 | 65 |
| Non-woven metallized carbon fiber veil (heavy) | 350 | 75 | 80 |
| Non-woven metallized carbon fiber veil (light) | 125 | 20 | 50 |
| CNT Tape | 20 | 20 | 45 |

As shown in Table 1, carbon nanotubes can provide significant shielding against electromagnetic radiation, even in the absence of metals, at much lower layer thicknesses than conventional fiber veils. Despite their light weight and good electrical conductivity values, carbon nanotube tapes made from pre-formed carbon nanotubes can be expensive and difficult to make, thereby making their widespread deployment problematic. Most often, the issues considered to be most problematic for manipulating carbon nanotubes involve debundling carbon nanotube ropes to form individual carbon nanotubes.

Although one might consider replacing or supplementing the metallization layer of conventional fiber veils with carbon nanotubes in order to increase their electrical conductivity, this approach does little to remedy the limited electromagnetic radiation shielding effectiveness within the apertures of the veil structures. Namely, individual carbon nanotubes and other conductive nanomaterials are usually so small that they simply pass through the apertures of a veil during a coating process, with only limited quantities of carbon nanotubes being retained on the fibers and leaving the apertures unprotected. Moreover, even carbon nanotubes that are initially deposited on the fibers of a veil in such a coating process are not readily retained thereafter, since they are ordinarily weakly held on the fibers and can pass through the veil apertures at a later time. Thus, carbon nanotubes ordinarily cannot bridge across the relatively wide apertures in a veil structure to form a surface having a substantially uniform optical coverage.

In order to provide carbon nanotubes in a form that addresses many of their handling and deployment issues in various applications, at least some of the present inventors previously developed techniques to prepare carbon nanostructures (CNSs) infused to various fiber materials through direct growth of the carbon nanostructures thereon. As used herein, the term "carbon nanostructure" refers to a plurality of carbon nanotubes that can exist as a polymeric structure by being interdigitated, branched, crosslinked, and/or sharing common walls with one another. Carbon nanostructures can be considered to have a carbon nanotube as a base monomer unit of their polymeric structure. By growing carbon nanostructures on a substrate (e.g., a fiber material) under carbon nanostructure growth conditions, at least a portion of the carbon nanotubes in the carbon nanostructures can be aligned substantially parallel to one another, much like the parallel carbon nanotube alignment seen in conventional carbon nanotube forests. The substantially parallel alignment can be maintained once the carbon nanostructures are removed from the growth substrate, as discussed below. Infusing carbon nanostructures to a fiber material by direct growth can allow the beneficial properties of the carbon nanotubes (i.e., any combination of chemical, mechanical, electrical, and thermal properties) to be conveyed to the fiber material and/or a matrix material in which the carbon nanostructure-infused fiber material is disposed. Moreover, by infusing carbon nanostructures to a fiber material, many of the handling difficulties and potential environmental health and safety concerns of individual carbon nanotubes can be avoided, since the risk of shedding the strongly bound carbon nanotubes is minimal. Although carbon nanostructure-infused fiber materials can be used to form custom fiber veils, the issue of limited electromagnetic radiation shielding in the apertures of the veil structures is not believed to be effectively remedied by this approach.

Conventional carbon nanotube growth processes have most often focused on the production of high purity carbon nanotubes containing a minimum number of defects. While such conventional carbon nanotube growth processes typically take several minutes or more to produce carbon nanotubes having micron-scale lengths, the carbon nanostructure growth processes described herein employ a nominal carbon nanotube growth rate on the order of several microns per second in a continuous, in situ growth process on a growth substrate. As a result, the carbon nanotubes within the carbon nanostructures are more defective compared to those in a conventional carbon nanotube forest or unbound carbon nanotubes. That is, the resultant carbon nanostructures contain carbon nanotubes that are highly entangled, branched, crosslinked, and share common walls, thereby forming a macrostructure that is defined by more than just the structural features of carbon nanotubes themselves. As a result, the carbon nanostructures have a highly porous macrostructure that is defined the carbon nanotubes and their connections to one another. Unlike carbon nanotube mats formed from pristine carbon nanotubes, the porous macrostructure in carbon nanostructures can be robustly maintained by the covalent connections between the carbon nanotubes. In essence, the carbon nanostructures contain carbon nanotubes that are in a "pre-exfoliated" state with the carbon nanotubes being well separated from one another, except where connections are made between adjacent carbon nanotubes through the branching, crosslinking, or sharing of common walls.

In most cases, prior preparations of carbon nanostructure-infused fiber materials have resulted in very robust adherence of the carbon nanostructures to the fiber material, such that the carbon nanostructures are not easily removed from the fiber material, at least without significantly damaging the carbon nanotubes themselves. Although carbon nanostructure-infused fiber materials can be used satisfactorily as a replacement for individual carbon nanotubes in many applications, at least some of the present inventors recognized that in certain instances it might be more desirable to utilize carbon nanostructures that are free of the fiber material upon which they are grown, while retaining the ready carbon nanotube handling attributes afforded by having the carbon nanostructures infused to the fiber material. Techniques for affecting removal of carbon nanostructures from a growth substrate are set forth hereinbelow and are described in more detail in commonly owned U.S. patent application Ser. No. 14/035,856 entitled "Carbon Nanostructures and Methods of Making the Same," filed on Sep. 24, 2013 and incorporated herein by reference in its entirety.

With regard to the shielding of electromagnetic radiation, particularly microwave radiation, the present inventors recognized that isolated carbon nanostructures can provide significant advantages over carbon nanotubes for forming an electrically conductive coating. Namely, carbon nanostructures can retain the electrical conductivity properties that can characterize ordinary carbon nanotubes, and these electrical conductivity properties can be conveyed to the fibers in veil structures when applied as a coating thereto. Unlike carbon nanotubes, which are not easily individualized or dispersed in a fluid phase, carbon nanostructures can be readily dispersed in a substantially non-agglomerated state, since their carbon nanotubes are already in a "pre-exfoliated" condition, thereby allowing the beneficial carbon nanotube properties to be better expressed. More significantly, however, isolated carbon nanostructures can provide a much more robust interaction with the fibers of a veil structure than can individual carbon nanotubes, which can provide significant advantages. Namely, isolated carbon nanostructures are macroscopic in size relative to individual carbon nanotubes, thereby allowing the carbon nanostructures to form conformal coatings on the fibers of a veil structure, while also bridging across the apertures defined between the fibers of the veil structure. Thus, not only do the carbon nanostructures not pass readily through the apertures of a veil, but they can also convey electromagnetic radiation shielding effects in the aperture regions of the veil that are otherwise substantially unprotected when coatings of other types of nanomaterials are applied. The macrostructured morphology of carbon nanostructures can also provide further advantages, as discussed hereinbelow.

Carbon nanostructures have a low areal weight, thereby allowing electromagnetic radiation shielding effects to be conveyed to a surface, such as a fiber veil, with little increase in weight. Moreover, carbon nanostructure-coated fiber veils remain highly flexible, thereby allowing them to be conformed to surfaces having a wide variety of shapes and compositions. Even when applied to a surface that is substantially non-conductive, the electromagnetic radiation shielding effects of the carbon nanostructure-coated fiber veils can be retained in their substantial entirety to convey shielding effects to the initially non-conductive surface.

In addition to the foregoing benefits, isolated carbon nanostructures can display a surprising synergy when applied as a coating to a substrate, such as a fiber veil. That is, the effect of applying isolated carbon nanostructures to a fiber veil can provide an effect that is more than additive for the fiber veil and the carbon nanostructures alone, as illustrated in Table 2 below. As shown in Table 2, the theoretical resistance of a carbon nanostructure-coated fiber veil (entry 4) was 3.7-fold higher than that actually measured (entry 3). The theoretical resistance of entry 4 was determined using a model of parallel resistances, in which the reciprocal resistance of the carbon nanostructure-coated fiber veil equals the sum of the reciprocal resistances of its constituents [i.e., isolated carbon nanostructures (entry 1) and the unmodified fiber veil (entry 2)]. Comparing the theoretical resistance (entry 4) against that actually measured (entry 3) shows that a 2.7-fold enhancement was obtained over that anticipated for a simple additive model. Although there is some variance in the data due to non-uniformity of the measured thicknesses, it is not believed that this variance is significant enough to account for the observed extent of the resistance enhancement.

TABLE 2

| Entry | Description | Thickness (µm) | Areal weight (g/m$^2$) | Resistance (mΩ) |
|---|---|---|---|---|
| 1 | Isolated Carbon Nanostructures | 21 | 8.3 | 5650 |
| 2 | Unmodified Ni/Fiber Veil | 57 | 8.8 | 3717 |
| 3 | Ni/Fiber Veil Coated with Carbon Nanostructures | 70 | 6.6 | 610 |
| 4 | Theoretical Values for Ni/Fiber Veil Coated with Carbon Nanostructures | 78 | 17.0 | 2242 |

Still further, the properties of carbon nanostructures can be tailored to some extent to provide some flexibility in the frequencies of electromagnetic radiation against which they provide protection. For example, carbon nanostructures can be readily functionalized by reactions similar to those used for functionalizing carbon nanotubes, thereby allowing the carbon nanostructures to be covalently modified to produce a desired set of properties. Various reactions for functionalizing carbon nanotubes will be familiar to one having ordinary skill in the art and may be applicable to the functionalization of carbon nanostructures in a like manner. Functionalization can also increase the degree of adherence to a fiber veil, including the possibility of establishing covalent bonds between the carbon nanostructures and the veil fibers, between the carbon nanotubes of the carbon nanostructures, or any combination thereof. Moreover, by increasing or decreasing the quantity of carbon nanostructures that are coated on a fiber veil, the degree of shielding against electromagnetic radiation can be altered accordingly.

A further advantage of carbon nanostructures over individual carbon nanotubes is that carbon nanostructures are believed to provide a better environmental health and safety profile compared to individual carbon nanotubes. Because a carbon nanostructure is macroscopic in size relative to an individual carbon nanotube, it is believed that freestanding carbon nanostructures can present fewer toxicity concerns and rival the environmental health and safety profile of carbon nanotubes infused to a fiber material. Without being bound by any theory, it is believed that the improved environmental health and safety profile of carbon nanostructures can result, at least in part, from the size and structural integrity of the carbon nanostructures themselves. That is, the bonding interactions between carbon nanotubes in carbon nanostructures can provide a robust material that does not readily separate into harmful submicron particulates, such as those associated with respiration toxicity.

As a further advantage of carbon nanostructures relative to individual carbon nanotubes, it is believed that carbon nanostructures can be produced much more rapidly and inexpensively and with a higher carbon feedstock conversion percentage than can related carbon nanotube production techniques. This feature can provide better process economics, especially for large scale operations. Some of the best performing carbon nanotube growth processes to date have exhibited a carbon conversion efficiency of at most about 60%. In contrast, carbon nanostructures can be produced on a fiber material with carbon conversion efficiencies of greater than about 85%. Thus, carbon nanostructures provide a more efficient use of carbon feedstock material and associated lower production costs.

In various embodiments, electrically conductive structures containing carbon nanostructures are described herein. In various embodiments, the electrically conductive structures can be configured as or applied to assemblies such as, for example, cables, buildings and other enclosures, and the like. In some embodiments, the electrically conductive structures can be freestanding. In other embodiments, the electrically conductive structures can be applied to a surface as an applique, thereby conveying electromagnetic radiation shielding effects to a surface that may be otherwise unprotected. In still other embodiments, the electrically conductive structures can be incorporated within a material, such as a filler within a composite.

In some embodiments, the electrically conductive structures described herein can include a support layer containing a plurality of fibers having apertures defined between the fibers, and a plurality of carbon nanostructures at least partially conformally coating the fibers and bridging across the apertures defined between adjacent fibers to form a continuous carbon nanostructure layer. As used herein, the term "continuous carbon nanostructure layer" refers to a layer structure in which the thickness of the layer is defined by the presence of carbon nanostructures at every point of a given layer thickness, which may be the surface of the layer structure. Each carbon nanostructure includes a plurality of carbon nanotubes that are branched, crosslinked, and share common walls with one another. It is to be recognized that every carbon nanotube in the plurality of carbon nanotubes does not necessarily have the foregoing structural features of branching, crosslinking, and sharing common walls. Rather, the plurality of carbon nanotubes as a whole can possess one or more of these structural features. That is, in some embodiments, at least a portion of the carbon nanotubes are branched, at least a portion of the carbon nanotubes are crosslinked, and at least a portion of the carbon nanotubes share common walls. FIGS. 1A-1C show illustrative depictions of carbon nanotubes 1-3 that are branched, crosslinked, and share common walls, respectively. The carbon nanotubes in the carbon nanostructures can be formed with branching, crosslinking, and sharing common walls with one another during formation of the carbon nanostructures on a growth substrate. Moreover, during formation of the carbon nanostructures on a growth substrate, the carbon nanotubes can be formed such that they are substantially parallel to one another in the carbon nanostructures. The carbon nanostructures can be considered to be a polymer having a carbon nanotube as a base monomer unit that is in parallel alignment with at least some other carbon nanotubes. Accordingly, in some embodiments, at least a portion of the carbon nanotubes in each carbon nanostructure are aligned substantially parallel to one another. In some embodiments, this type of local alignment can be maintained once the carbon nanostructures have been coated on a support layer. In other embodiments, the carbon nanotubes of the carbon nanostructures are at least partially non-aligned once disposed as a coating.

In some embodiments, the carbon nanostructures can have a web-like morphology that results in the carbon nanostructures having a low initial bulk density. The low bulk density of carbon nanostructures can make them suitable for application to fiber veils and other support layers without greatly changing the areal weight of the support layer upon coating. As-produced carbon nanostructures can have a bulk density ranging between about 0.003 g/cm$^3$ and about 0.015 g/cm$^3$. Further manipulation can raise the initial bulk density to between about 0.1 g/cm$^3$ to about 0.15 g/cm$^3$. In some embodiments, the bulk density of the carbon nanostructures can be further altered by forming a coating on the carbon nanotubes of the carbon nanostructures and/or infiltrating the interior of the carbon nanostructures with various materials. Coating the carbon nanotubes and/or infiltrating the interior of the carbon nanostructures can also be used to further tailor the properties of the carbon nanostructures for use in various applications. For example, in some embodiments described herein, at least a portion of the carbon nanotubes in the carbon nanostructures can be coated with a metal to alter the degree of interaction with particular frequencies of electromagnetic radiation. Infiltration of the carbon nanostructure pores with a metal or other conductive additive can function in a like manner. That is, in some embodiments, at least a portion of the carbon nanostructures can contain a conductive additive located within a pore space of the carbon nanostructures.

In various embodiments, the plurality of fibers in the support layer can include a plurality fibers of finite length. That is, in some embodiments, the plurality of fibers in the support layer can include a plurality of chopped fibers. In some embodiments, the fibers can include carbon fibers, glass fibers, or any combination thereof. Other fibers such as metal fibers, ceramic fibers, and organic fibers can also be used in some embodiments. In some embodiments, the plurality of fibers in the support layer can be oriented randomly with respect to one another. In other embodiments, at least a portion of the fibers in the support layer can be aligned with respect to one another. Depending on how the fibers are oriented with respect to one another, apertures of varying sizes can be defined between the fibers. In various embodiments, the apertures can range from about 10 microns to about 1 cm in size, although this size may not be consistent throughout the entirety of the fiber veil. For example, in a multi-layer fiber veil the aperture size can decrease in proceeding from an outer layer of the fiber veil to an inner layer, and then further decrease or increase again on proceeding deeper into the fiber veil.

In some embodiments, the fibers in the support layer can be coated with a metallization layer, which can desirably increase the electrical conductivity of the fibers. In various embodiments, the metallization layer can be located between the fibers and the carbon nanostructures conformally coated thereto. The identity of the metal forming the metallization layer is not believed to be particularly limited. In more particular embodiments, the metallization layer can include a metal such as nickel, copper, or any combination thereof. The thickness of the metallization layer can vary widely and generally ranges between about 1 nm to about 50 microns. In more particular embodiments, the metallization layer can range between about 10 nm and about 1 micron in thickness, or between about 100 nm and about 1 micron in thickness.

In some embodiments, the plurality of fibers can include carbon nanostructure-infused fibers that have carbon nanostructures grown from a surface of the fiber material. Carbon nanostructure-infused fibers can be electrically conductive, much like fibers that are coated with a metallization layer. That is, in some embodiments, a plurality of carbon nanostructures can be conformally coated onto carbon nanostructure-infused fibers that have existing carbon nanostructures thereon, which make up the support structure of a fiber veil. The carbon nanostructure-infused fibers forming at least a portion of the support layer can represent the same source of carbon nanostructures used for forming a conformal coating on the fibers, or the carbon nanostructure-infused fibers and the carbon nanostructures of the conformal coating can be obtained from different sources. Accordingly, the properties of the carbon nanostructures can be the same or different depending upon whether the carbon nanostructure-infused fibers and carbon nanostructures of the conformal coating are obtained from the same source or a different source. Differences in the properties of the carbon nanostructures can be utilized to further tailor the electromagnetic shielding properties of the coated fibers.

Figure 2:
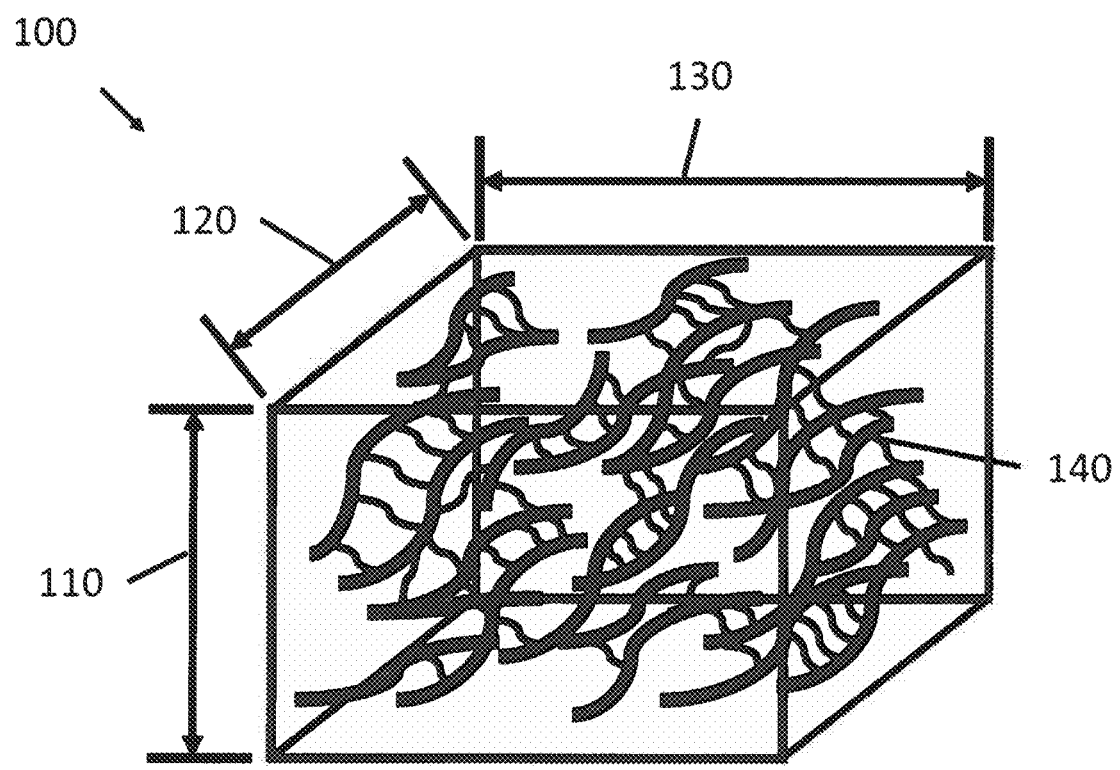
FIG. 2 shows an illustrative depiction of a carbon nanostructure flake material after isolation of the carbon nanostructure from a growth substrate.

In some embodiments, the carbon nanostructures can be free of a growth substrate adhered to the carbon nanostructures. That is, in some embodiments, the carbon nanostructures conformally coated on the plurality of fibers can include carbon nanostructures that have been removed from their growth substrate. In some embodiments, the carbon nanostructures can be in the form of a flake material after being removed from the growth substrate upon which the carbon nanostructures are initially formed. As used herein, the term "flake material" refers to a discrete particle having finite dimensions. FIG. 2 shows an illustrative depiction of a carbon nanostructure flake material after isolation of the carbon nanostructure from a growth substrate. Flake structure 100 can have first dimension 110 that is in a range from about 1 nm to about 35 microns thick, particularly about 1 nm to about 500 nm thick, including any value in between and any fraction thereof. Flake structure 100 can have second dimension 120 that is in a range from about 1 micron to about 750 microns tall, including any value in between and any fraction thereof. Flake structure 100 can have third dimension 130 that is only limited in size based on the length of the growth substrate upon which the carbon nanostructures are initially formed. For example, in some embodiments, the process for growing carbon nanostructures on a growth substrate can take place on a tow or roving of a fiber-based material of spoolable dimensions. The carbon nanostructure growth process can be continuous, and the carbon nanostructures can extend the entire length of a spool of fiber. Thus, in some embodiments, third dimension 130 can be in a range from about 1 m to about 10,000 m wide. Again, third dimension 130 can be very long because it represents the dimension that runs along the axis of the growth substrate upon which the carbon nanostructures are formed. Third dimension 130 can also be decreased to any desired length less than 1 m. For example, in some embodiments, third dimension 130 can be on the order of about 1 micron to about 10 microns, or about 10 microns to about 100 microns, or about 100 microns to about 500 microns, or about 500 microns to about 1 cm, or about 1 cm to about 100 cm, or about 100 cm to about 500 cm, up to any desired length, including any amount between the recited ranges and any fractions thereof. Since the growth substrates upon which the carbon nanostructures are formed can be quite large, exceptionally high molecular weight carbon nanostructures can be produced by forming the polymer-like morphology of the carbon nanostructures as a continuous layer on a suitable growth substrate.

Referring still to FIG. 2, flake structure 100 can include a webbed network of carbon nanotubes 140 in the form of a carbon nanotube polymer (i.e., a "carbon nanopolymer") having a molecular weight in a range from about 15,000 g/mol to about 150,000 g/mol, including all values in between and any fraction thereof. In some embodiments, the upper end of the molecular weight range can be even higher, including about 200,000 g/mol, about 500,000 g/mol, or about 1,000,000 g/mol. The higher molecular weights can be associated with carbon nanostructures that are dimensionally long. In various embodiments, the molecular weight can also be a function of the predominant carbon nanotube diameter and number of carbon nanotube walls present within the carbon nanostructures. In some embodiments, the carbon nanostructures can have a crosslinking density ranging between about 2 mol/cm$^3$ to about 80 mol/cm$^3$. The crosslinking density can be a function of the carbon nanostructure growth density on the surface of the growth substrate as well as the carbon nanostructure growth conditions.

Figure 3:
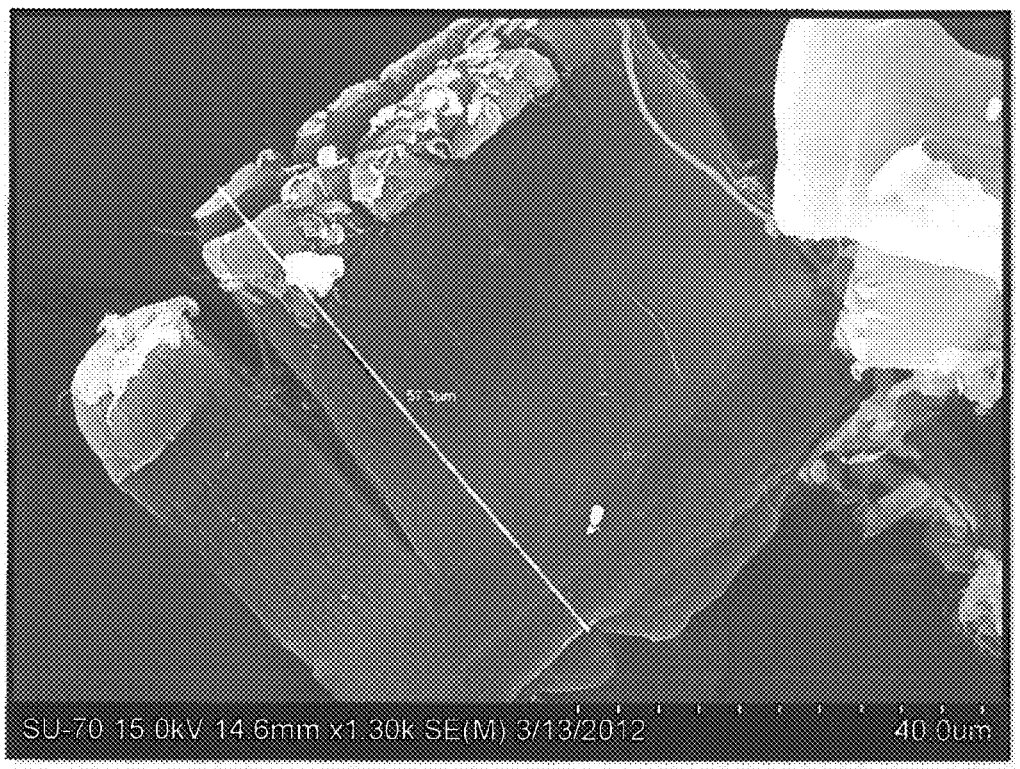
FIG. 3 shows an SEM image of an illustrative carbon nanostructure obtained as a flake material.

FIG. 3 shows an SEM image of an illustrative carbon nanostructure obtained as a flake material. The carbon nanostructure shown in FIG. 3 exists as a three dimensional microstructure due to the entanglement and crosslinking of its highly aligned carbon nanotubes. The aligned morphology is reflective of the formation of the carbon nanotubes on a growth substrate under rapid carbon nanotube growth conditions (e.g., several microns per second, such as about 2 microns per second to about 10 microns per second), thereby inducing substantially perpendicular carbon nanotube growth from the growth substrate. Without being bound by any theory or mechanism, it is believed that the rapid rate of carbon nanotube growth on the growth substrate can contribute, at least in part, to the complex structural morphology of the carbon nanostructures. In addition, the as-produced bulk density of the carbon nanostructures can be modulated to some degree by adjusting the carbon nanostructure growth conditions, including, for example, by changing the concentration of transition metal nanoparticle catalyst particles that are disposed on the growth substrate to initiate carbon nanotube growth. Suitable transition metal nanoparticle catalysts and carbon nanostructure growth conditions are outlined in more detail below.

In some embodiments, at least a portion of the carbon nanostructures conformally coating the plurality of fibers in the support layer can be functionalized. The reactions used to functionalize the carbon nanostructures can involve the same types of reactions used to functionalize carbon nanotubes. A number of reactions suitable for functionalizing carbon nanotubes will be familiar to one having ordinary skill in the art and can be adapted to the functionalization of carbon nanostructures by one having the benefit of the present disclosure. For example, in some embodiments, at least a portion of the carbon nanostructures can be hydroxylated or carboxylated in order to facilitate their dispersal in a fluid phase using techniques analogous to those used for functionalizing carbon nanotubes.

In some embodiments, at least a portion of the carbon nanostructures can be covalently bonded together. That is, when multiple carbon nanostructures are present (e.g., as a carbon nanostructure flake material), at least a portion of otherwise separated carbon nanostructures can be covalently bonded to one another. Covalent bonding between the carbon nanostructures can take place via functional groups introduced as described above. For example, in some embodiments, carboxylic acid groups or hydroxyl groups introduced to the carbon nanostructures can be used to establish covalent bonds between the carbon nanostructures.

Various additives can also be found in or on the carbon nanostructures. Additives that can be present include, but are not limited to, a coating on the carbon nanotubes, a filler material in the interstitial space of the carbon nanostructures, transition metal nanoparticles, residual growth substrate that is not adhered to the carbon nanostructures, and any combination thereof. In some embodiments, certain additives can be covalently bonded to at least a portion of the carbon nanotubes in at least some of the carbon nanostructures. It is not anticipated that residual growth substrate will be covalently bonded to the carbon nanostructures in the embodiments described herein, since the carbon nanostructures have been harvested from the growth substrate, as described hereinafter. In some embodiments, a coating or a filler material associated with the carbon nanostructures can be conductive, such as metal.

Coatings can be applied to the carbon nanotubes of the carbon nanostructures before or after removal of the carbon nanostructures from their growth substrates. Application of a coating before removal of the carbon nanostructures from their growth substrates can, for example, protect the carbon nanotubes during the removal process or facilitate the removal process. In other embodiments, a coating can be applied to the carbon nanotubes of the carbon nanostructures after removal of the carbon nanostructures from their growth substrates. Application of a coating to the carbon nanotubes of the carbon nanostructures after removal from their growth substrates can desirably facilitate handling and storage of the carbon nanostructures, increase their bulk density, and improve their processibility. Moreover, in some embodiments, a metal coating on the carbon nanotubes can desirably increase the conductivity of the carbon nanostructures, thereby further enhancing the shielding of electromagnetic radiation according to the embodiments described herein.

Figure 6:
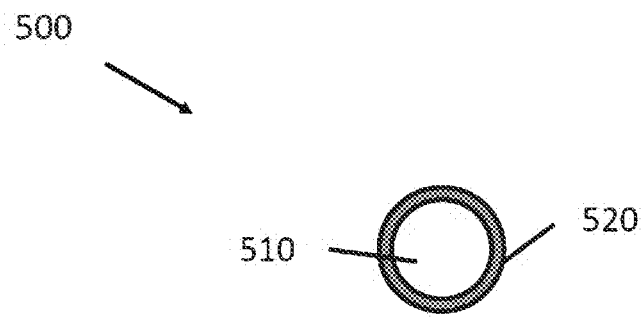
FIG. 6 shows an illustrative schematic of a transition metal nanoparticle coated with an anti-adhesive layer.

In some or other embodiments, the carbon nanostructures can contain a plurality of transition metal nanoparticles, where the transition metal nanoparticles can represent a catalyst that was used in synthesizing the carbon nanostructures. In some embodiments, the transition metal nanoparticles can be coated with an anti-adhesive coating that limits their adherence to a growth substrate or the carbon nanostructure to a growth substrate, as shown in FIG. 6. Suitable anti-adhesive coatings are discussed in more detail below. In various embodiments, the anti-adhesive coating can be carried along with the transition metal nanoparticles as the carbon nanostructures and the transition metal nanoparticles are removed from the growth substrates. In other embodiments, the anti-adhesive coating can be removed from the transition metal nanoparticles before or after they are incorporated into the carbon nanostructures. In still other embodiments, the transition metal nanoparticles can initially be incorporated into the carbon nanostructures and then subsequently removed. For example, in some embodiments, at least a portion of the transition metal nanoparticles can be removed from the carbon nanostructures by treating the carbon nanostructures with a mineral acid.

In some or other embodiments, the carbon nanostructures described herein can contain a growth substrate that is not adhered to the carbon nanostructures. As described further hereinbelow, the carbon nanostructures that are initially formed can sometimes contain fragmented growth substrate that is produced during the carbon nanostructure removal process. In some embodiments, the fragmented growth substrate can remain with the carbon nanostructures. In other embodiments, the growth substrate can be subsequently removed from the carbon nanostructures, as described in more detail below.

In some embodiments, the carbon nanostructures being applied to the support layer can be made by a process including forming carbon nanostructures on a growth substrate, and removing the carbon nanostructures from the growth substrate. Further details of the growth and removal processes are provided hereinbelow. During formation on the growth substrate, the carbon nanotubes in each carbon nanostructure can be formed with branching, crosslinking, and sharing common walls with one another. After removal from the growth substrate, the plurality of the carbon nanostructures (e.g., in the form of a carbon nanostructure flake material) can be dispersed in a fluid phase and applied to the plurality of fibers to form an electrically conductive structure, as described in greater detail hereinbelow.

Due to their flexibility and light weight, the electrically conductive structures described herein can be applied to a wide variety of surfaces. As a result, the electrically conductive structures can take on a number of shapes. Illustrative surfaces to which the electrically conductive structures can be applied include, for example, containers, buildings, cables, and the like. In some embodiments, the electrically conductive structures can be substantially planar, as occurs when the electrically conductive structure is applied to a substantially flat surface, such as the side of a building. In other embodiments, the electrically conductive structures can be substantially cylindrical, as when the electrically conductive structure is applied to a substantially cylindrical surface, such as the exterior of a cable or a wire. Other three-dimensional shapes are possible when applying the electrically conductive structure to other non-planar surfaces, which are also encompassed within the scope of the present disclosure.

In some embodiments, the electrically conductive structures can further include a surface to which the electrically conductive structure is applied. In some embodiments, the electrically conductive structures can be applied to a surface that is not by itself considered to be electrically conductive. That is, the electrically conductive structures can be applied to a surface that does not have any inherent shielding protection against electromagnetic radiation in order to provide a "skin" that conveys electromagnetic radiation protection to the surface. For example, in some embodiments, the electrically conductive structures can be applied to a polymer to form a polymer-containing electromagnetic radiation shield. Other non-conductive substances that can have electrically conductive structures of the present disclosure similarly applied thereto can be envisioned by one having ordinary skill in the art.

The electrically conductive structures described herein can provide good protection against electromagnetic radiation over a wide range of frequencies. In various embodiments, the electrically conductive structures can exhibit shielding against electromagnetic radiation over a frequency range between about 30 MHz to about 8 GHz. In particularly desirable embodiments, the electrically conductive structures can exhibit shielding against electromagnetic radiation at a frequency of less than 1 GHz. Shielding against such frequencies are of particular interest to the aerospace and aeronautics industry and are often not well shielded by conventional fiber veils.

Methods for conformally coating carbon nanostructures on a plurality of fibers will now be described in greater detail. In some embodiments, the electrically conductive structures can be produced from existing fiber veils, which can be commercially available fiber veils in some embodiments. In alternative embodiments, a fiber veil can be produced from a custom fiber type (e.g., carbon nanostructure-infused fibers in some embodiments), and carbon nanostructures can then be deposited thereon. In still other embodiments, a plurality of chopped fibers and carbon nanostructures can be co-deposited with one another to form a plurality of fibers having a plurality of carbon nanostructures conformally coated thereon.

In some embodiments, electrically conductive structures can be produced from an existing fiber veil by conformally coating carbon nanostructures thereon. In some embodiments, methods for forming an electrically conductive structure in such a manner can include providing a mixture containing a solvent and a plurality of carbon nanostructures, dispersing the carbon nanostructures in the solvent until the carbon nanostructures are substantially non-agglomerated, and passing the solvent though a support layer containing a plurality of fibers having apertures defined between the fibers, whereby the carbon nanostructures become at least partially conformally coated around the fibers and bridge across the apertures defined between adjacent fibers to form a continuous carbon nanostructure layer. Each carbon nanostructure contains a plurality of carbon nanotubes that are branched, crosslinked, and share common walls with one another.

In some embodiments, the support layer can be a commercially available fiber veil. In other embodiments, the support layer can be custom-formed from a plurality of chopped fibers prior to exposing the carbon nanostructures thereto. In some embodiments, a custom fiber veil can be formed by collecting a plurality of fibers from a fluid dispersion of chopped fibers, such that apertures are defined between the collected fibers. For example, in some embodiments, a custom fiber veil can be formed by filtering a fluid dispersion of chopped fibers with vacuum assistance. When an existing fiber veil has carbon nanostructures applied thereto, passing the solvent through the support layer of the fiber veil can take place with vacuum assistance in some embodiments. Prior to coating carbon nanostructures thereon, a metallization layer can be present on the fibers. Such metallization layers, discussed in more detail above, can be applied to the fibers either before their formation into the fiber veil or afterward. Thus, in such embodiments, the carbon nanostructures are applied to the metallization layer of the fiber veil Likewise, in some embodiments, an electrically conductive structure can be formed in which a fiber veil is formed by co-depositing a plurality of chopped fibers and a plurality of carbon nanostructures from a fluid dispersion. Co-depositing the plurality of chopped fibers and the plurality of carbon nanostructures to coat the plurality of chopped fibers can similarly take place with vacuum assistance in some embodiments. For fiber veils that are formed by co-depositing chopped fibers and carbon nanostructures, a metallization layer can be applied to the fibers before their formation in the fiber veil. Thus, in such embodiments, the carbon nanostructures can again be applied to the metallization layer of the fiber veil.

In some embodiments, the methods described herein can include, forming a mixture containing a plurality of carbon nanostructures and a plurality of chopped fibers in a solvent, and filtering the mixture to collect the chopped fibers and carbon nanostructures as a layer structure in which the carbon nanostructures at least partially conformally coat the fibers and bridge across apertures defined between adjacent fibers. In some embodiments, filtering the mixture can take place by vacuum filtration.

In some embodiments, the carbon nanostructures being mixed or provided in a solvent can include a carbon nanostructure flake material. Other forms of carbon nanostructures that have been liberated from a growth substrate are also contemplated by the various embodiments described herein.

In some embodiments, dispersing the carbon nanostructures in a solvent can include sonicating the mixture containing the carbon nanostructures. Sonication not only can promote dispersion of the carbon nanostructures in the solvent such that adjacent carbon nanostructures are not agglomerated with each other, but the sonication energy is also believed to alter the original morphology of the carbon nanostructures such that they are better able to form a conformal coating on the fibers of the support layer and bridge across the apertures defined therein. Without being bound by any theory or mechanism, it is believed that applying sonication energy to a solvent mixture containing carbon nanostructures can deform the original carbon nanostructure morphology such that the carbon nanotubes of the carbon nanostructure are even more separated from one another. For example, a gel-like structure can be formed from a solvent dispersion of a carbon nanostructure flake material in some embodiments. As a result of sonication, the carbon nanostructures can become more compliant and have enhanced capabilities for forming a conformal coating on the fibers of the support layer.

Figure 4A:
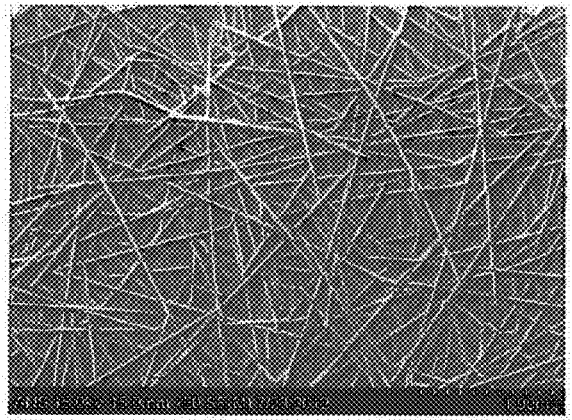
FIG. 4A shows an SEM image of an illustrative fiber veil before the application of a conformal coating of carbon nanostructures to the fibers therein.
Figure 4B:
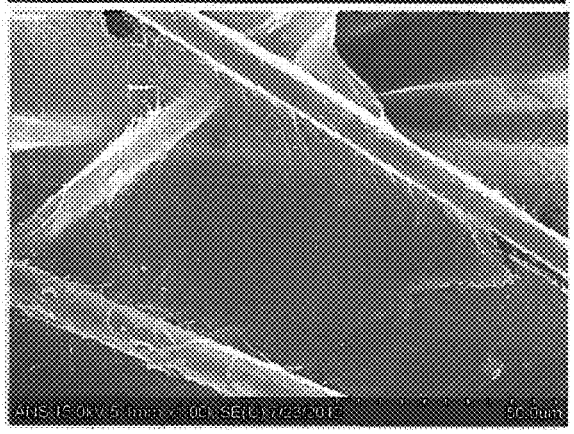
FIGS. 4B and 4C show SEM images of an illustrative fiber veil after the application of carbon nanostructures thereto as a conformal coating.
Figure 4C:
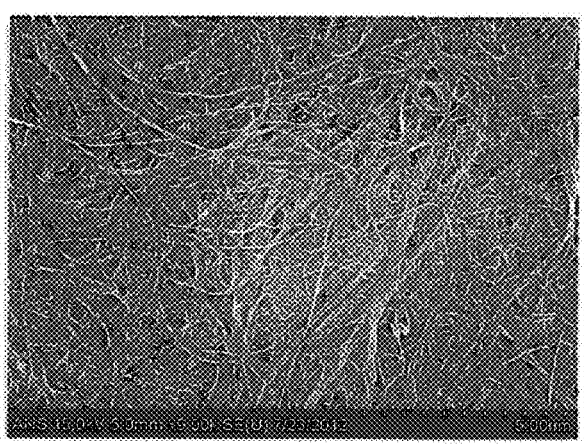

FIG. 4A shows an SEM image of an illustrative fiber veil before the application of a conformal coating of carbon nanostructures to the fibers therein. FIGS. 4B and 4C show SEM images of an illustrative fiber veil after the application of carbon nanostructures thereto as a conformal coating. As shown in FIG. 4B, the carbon nanostructures conformally coat the fibers of the veil and bridge across the apertures defined between the depicted adjacent fibers. In the increasing magnification image of FIG. 4C, the branched, crosslinked, and shared-wall morphology of the carbon nanostructures can be seen. Further testing data of the carbon nanostructure-coated fiber veils is provided in the Examples hereinbelow.

One illustrative method for making a carbon nanostructure-coated fiber veil will now be described. It is to be recognized that various modifications can be made in this process, and the description that follows should not be considered to limit the present disclosure. After providing harvested carbon nanostructures, the carbon nanostructures can be mixed with a solvent such as, for example, a water:alcohol solution (e.g., 1:1). The mixture can then be sonicated for several minutes to reduce agglomeration and disperse the carbon nanostructures. Meanwhile, a carbon fiber veil or like porous substrate, with or without a metallization layer, can be placed in a vacuum filtration funnel. The carbon nanostructure mixture can then be poured over the carbon fiber veil while pulling vacuum on the funnel, such that the liquid passes through the carbon fiber veil and the carbon nanostructures become deposited thereon. Next, the coated carbon fiber veil can be removed from the funnel and placed on a piece of Teflon. The coated carbon fiber veil can then be dried in an oven (e.g., at 300° F.) for several minutes and then removed from the oven.

Production of carbon nanostructures on a growth substrate and subsequent removal of the carbon nanostructures from the growth substrate by various techniques are now further described hereinbelow.

In some embodiments, processes described herein can include preparing carbon nanostructures on a growth substrate with one or more provisions for removal of the carbon nanostructures once synthesis of the carbon nanostructures is complete. The provision(s) for removing the carbon nanostructures from the growth substrate can include one or more techniques selected from the group consisting of: (i) providing an anti-adhesive coating on the growth substrate, (ii) providing an anti-adhesive coating on a transition metal nanoparticle catalyst employed in synthesizing the carbon nanostructures, (iii) providing a transition metal nanoparticle catalyst with a counter ion that etches the growth substrate, thereby weakening the adherence of the carbon nanostructures to the growth substrate, and (iv) conducting an etching operation after carbon nanostructure synthesis is complete to weaken adherence of the carbon nanostructures to the growth substrate. Combinations of these techniques can also be used. In combination with these techniques, various fluid shearing or mechanical shearing operations can be carried out to affect the removal of the carbon nanostructures from the growth substrate.

In some embodiments, processes disclosed herein can include removing carbon nanostructures from a growth substrate. In some embodiments, removing carbon nanostructures from a growth substrate can include using a high pressure liquid or gas to separate the carbon nanostructures from the growth substrate, separating contaminants derived from the growth substrate (e.g., fragmented growth substrate) from the carbon nanostructures, collecting the carbon nanostructures with air or from a liquid medium with the aid of a filter medium, and isolating the carbon nanostructures from the filter medium. In various embodiments, separating contaminants derived from the growth substrate from the carbon nanostructures can take place by a technique selected from the group consisting of cyclone filtering, density separation, size-based separation, and any combination thereof. The foregoing processes are described in more detail hereinbelow.

Figure 5:
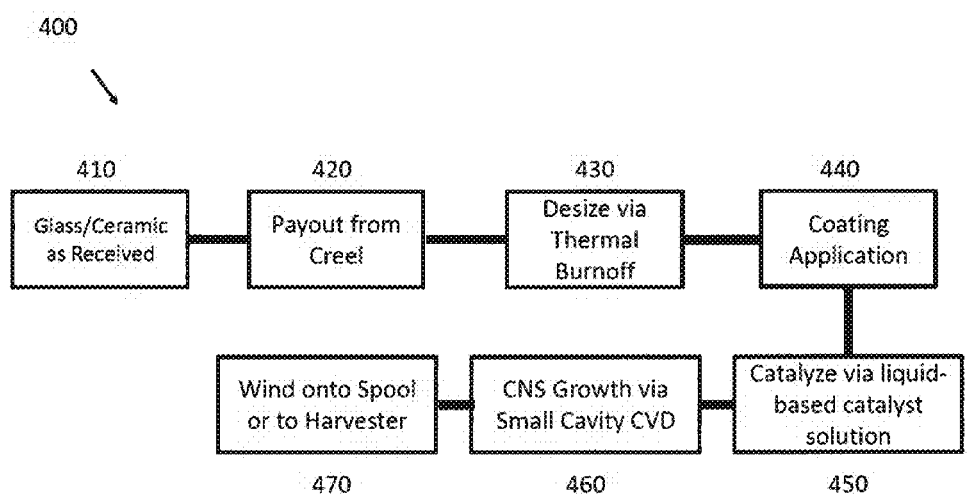
FIG. 5 shows a flow diagram of an illustrative carbon nanostructure growth process which employs an exemplary glass or ceramic growth substrate.

FIG. 5 shows a flow diagram of an illustrative carbon nanostructure growth process 400, which employs an exemplary glass or ceramic growth substrate 410. It is to be understood that the choice of a glass or ceramic growth substrate is merely exemplary, and the substrate can also be metal, an organic polymer (e.g., aramid), basalt fiber, or carbon, for example. In some embodiments, the growth substrate can be a fiber material of spoolable dimensions, thereby allowing formation of the carbon nanostructures to take place continuously on the growth substrate as the growth substrate is conveyed from a first location to a second location. Carbon nanostructure growth process 400 can employ growth substrates in a variety of forms such as fibers, tows, yarns, woven and non-woven fabrics, sheets, tapes, belts and the like. For convenience in continuous syntheses, tows and yarns are particularly convenient fiber materials.

Referring still to FIG. 5, such a fiber material can be meted out from a payout creel at operation 420 and delivered to an optional desizing station at operation 430. Desizing is ordinarily conducted when preparing carbon nanostructure-infused fiber materials in order to increase the degree of infusion of the carbon nanostructure to the fiber material. However, when preparing isolated carbon nanostructures, desizing operation 430 can be skipped, for example, if the sizing promotes a decreased degree of adhesion of the transition metal nanoparticle catalyst and/or carbon nanostructures to the growth substrate, thereby facilitating removal of the carbon nanostructures. Numerous sizing compositions associated with fiber substrates can contain binders and coupling agents that primarily provide anti-abrasive effects, but typically do not exhibit exceptional adhesion to fiber surface. Thus, forming carbon nanostructures on a growth substrate in the presence of a sizing can actually promote subsequent isolation of the carbon nanostructures in some embodiments. For this reason, it can be beneficial to skip desizing operation 430, in some embodiments.

In some embodiments, an additional coating application can take place at operation 440. Additional coatings that can be applied in operation 440 include, for example, colloidal ceramics, glass, silanes, or siloxanes that can decrease catalyst and/or carbon nanostructure adhesion to the growth substrate. In some embodiments, the combination of a sizing and the additional coating can provide an anti-adhesive coating that can promote removal of the carbon nanostructures from the growth substrate. In some embodiments, the sizing alone can provide sufficient anti-adhesive properties to facilitate carbon nanostructure removal from the growth substrate, as discussed above. In some embodiments, the additional coating provided in operation 440 alone can provide sufficient anti-adhesive properties to facilitate carbon nanostructure removal from the growth substrate. In still further embodiments, neither the sizing nor the additional coating, either alone or in combination, provides sufficient anti-adhesive properties to facilitate carbon nanostructure removal. In such embodiments, decreased adhesion of the carbon nanostructures to the growth substrate can be attained by judicious choice of the transition metal nanoparticles used to promote growth of the carbon nanostructures on the growth substrate. Specifically, in some such embodiments, operation 450 can employ a catalyst that is specifically chosen for its poor adhesive characteristics.

Referring still to FIG. 5, after optional desizing operation 430 and optional coating operation 440, catalyst is applied to the growth substrate in operation 450, and carbon nanostructure growth is affected through a small cavity CVD process in operation 460. The resulting carbon nanostructure-infused growth substrate (i.e., a carbon nanostructure-infused fiber material) can be wound for storage and subsequent carbon nanostructure removal or immediately taken into a carbon nanostructure isolation process employing a harvester, as indicated in operation 470.

In some embodiments, the growth substrate can be modified to promote removal of carbon nanostructures therefrom. In some embodiments, the growth substrate used for producing carbon nanostructures can be modified to include an anti-adhesive coating that limits adherence of the carbon nanostructures to the growth substrate. The anti-adhesive coating can include a sizing that is commercially applied to the growth substrate, or the anti-adhesive coating can be applied after receipt of the growth substrate. In some embodiments, a sizing can be removed from the growth substrate prior to applying an anti-adhesive coating. In other embodiments, a sizing can be applied to a growth substrate in which a sizing is present.

In some embodiments, the carbon nanostructures can be grown on the growth substrate from a catalyst that includes a plurality of transition metal nanoparticles, as general described hereinbelow. In some embodiments, one mode for catalyst application onto the growth substrate can be through particle adsorption, such as through direct catalyst application using a liquid or colloidal precursor-based deposition. Suitable transition metal nanoparticle catalysts can include any d-block transition metal or d-block transition metal salt. In some embodiments, a transition metal salt can be applied to the growth substrate without thermal treatments. In other embodiments, a transition metal salt can be converted into a zero-valent transition metal on the growth substrate through a thermal treatment.

In some embodiments, the transition metal nanoparticles can be coated with an anti-adhesive coating that limits their adherence to the growth substrate. As discussed above, coating the transition metal nanoparticles with an anti-adhesive coating can also promote removal of the carbon nanostructures from the growth substrate following synthesis of the carbon nanostructure. Anti-adhesive coatings suitable for use in conjunction with coating the transition metal nanoparticles can include the same anti-adhesive coatings used for coating the growth substrate. FIG. 6 shows an illustrative schematic of a transition metal nanoparticle coated with an anti-adhesive layer. As shown in FIG. 6, coated catalyst 500 can include core catalyst particle 510 overcoated with anti-adhesive layer 520. In some embodiments, colloidal nanoparticle solutions can be used in which an exterior layer about the nanoparticle promotes growth substrate to nanoparticle adhesion but discourages carbon nanostructure to nanoparticle adhesion, thereby limiting adherence of the carbon nanostructures to the growth substrate.

Figure 7:
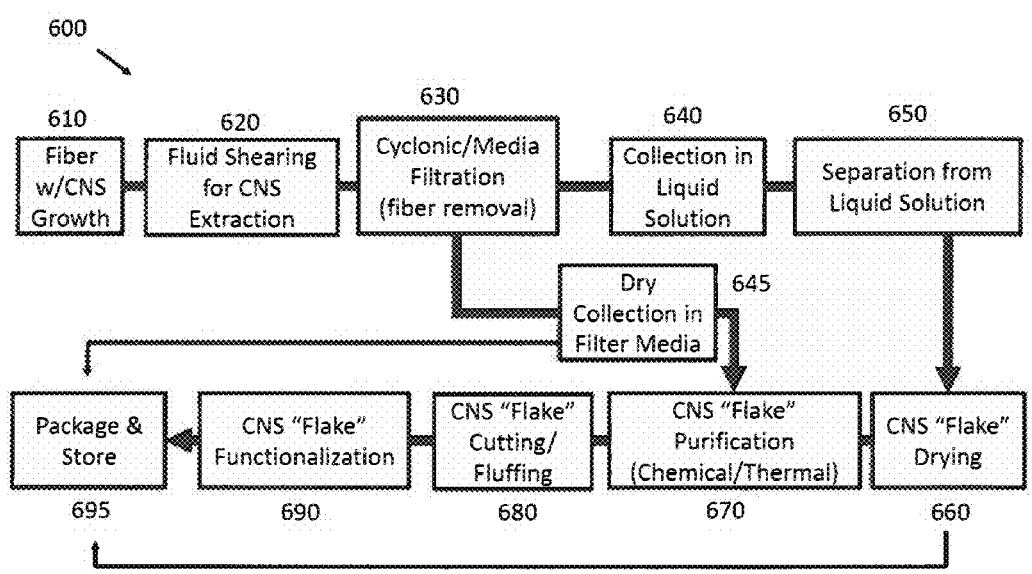
FIG. 7 shows a flow diagram of an illustrative process for isolating carbon nanostructures from a growth substrate.

FIG. 7 shows a flow diagram of an illustrative process for isolating carbon nanostructures from a growth substrate. As shown in FIG. 7, process 600 begins with a carbon nanostructure-infused fiber being provided in operation 610. Non-fibrous growth substrates onto which a carbon nanostructure has been grown can be used in a like manner. Fluid shearing can be conducted at operation 620 using a gas or a liquid in order to accomplish removal of the carbon nanostructures from the fiber material. In some cases, fluid shearing can result in at least a portion of the fiber material being liberated from the bulk fiber and incorporated with the free carbon nanostructures, while not being adhered thereto. If needed, in operation 630, the liberated carbon nanostructures can be subjected to cyclonic/media filtration in order to remove the non-adhered fiber material fragments. Density-based or size-based separation techniques can also be used to bring about separation of the carbon nanostructures from the non-adhered fiber material. In the case of gas shearing, the carbon nanostructures can be collected in dry form on a filter medium in operation 645. The resultant dry flake material collected in operation 645 can be subjected to any optional further chemical or thermal purification, as outlined further in FIG. 8. In the case of liquid shearing, the liquid can be collected in operation 640, and separation of the carbon nanostructures from the liquid can take place in operation 650, ultimately producing a dry flake material in operation 660. The carbon nanostructure flake material isolated in operation 660 can be similar to that produced in operation 645. After isolating the carbon nanostructure flake material in operation 660, it can be ready for packaging and/or storage in operation 695. In processes employing gas shearing to remove the carbon nanostructures, the carbon nanostructures can be dry collected in a filter at operation 645. Prior to packaging and/or storage in operation 695, the crude product formed by either shearing technique can undergo optional chemical and/or thermal purification in operation 670. These purification processes can be similar to those conducted when purifying traditional carbon nanotubes. By way of example, purification conducted in operation 670 can involve removal of a catalyst used to affect carbon nanostructure growth, such as, for example, through treatment with liquid bromine. Other purification techniques can be envisioned by one having ordinary skill in the art.

Referring still to FIG. 7, the carbon nanostructures produced by either shearing technique can undergo further processing by cutting or fluffing in operation 680. Such cutting and fluffing can involve mechanical ball milling, grinding, blending, chemical processes, or any combination thereof. Further optionally, in operation 690, the carbon nanostructures can be further functionalized using any technique in which carbon nanotubes are normally modified or functionalized. Suitable functionalization techniques in operation 690 can include, for example, plasma processing, chemical etching, and the like. Functionalization of the carbon nanostructures in this manner can produce chemical functional group handles that can be used for further modifications. For example, in some embodiments, a chemical etch can be employed to form carboxylic acid groups on the carbon nanostructures that can be used to bring about covalent attachment to any number of further entities including, for example, the matrix material of a composite material. In this regard, functionalized carbon nanostructures can provide a superior reinforcement material in a composite matrix, since it can provide multiple sites for covalent attachment to the composite's matrix material in all dimensions.

In addition to facilitating the covalent attachment of carbon nanostructures to the matrix of a composite material, functionalization of carbon nanostructures can also allow other groups to be covalently attached to the carbon nanostructures. In some embodiments, access to other covalently linked entities such as synthetic or biopolymers can be realized via functional group handles produced in post-processing carbon nanostructure functionalization. For example, carbon nanostructures can be linked to polyethylene glycol (e.g., through ester bonds formed from carboxylic acid groups on the carbon nanostructure) to provide PEGylated carbon nanostructures, which can confer improved water solubility to the carbon nanostructures. In some embodiments, the carbon nanostructures can provide a platform for covalent attachment to biomolecules to facilitate biosensor manufacture. In this regard, the carbon nanostructures can provide improved electrical percolation pathways for enhanced detection sensitivity relative to other carbon nanotube-based biosensors employing individualized carbon nanotubes or even conventional carbon nanotube forests. Biomolecules of interest for sensor development can include, for example, peptides, proteins, enzymes, carbohydrates, glycoproteins, DNA, RNA, and the like.

Figure 8:
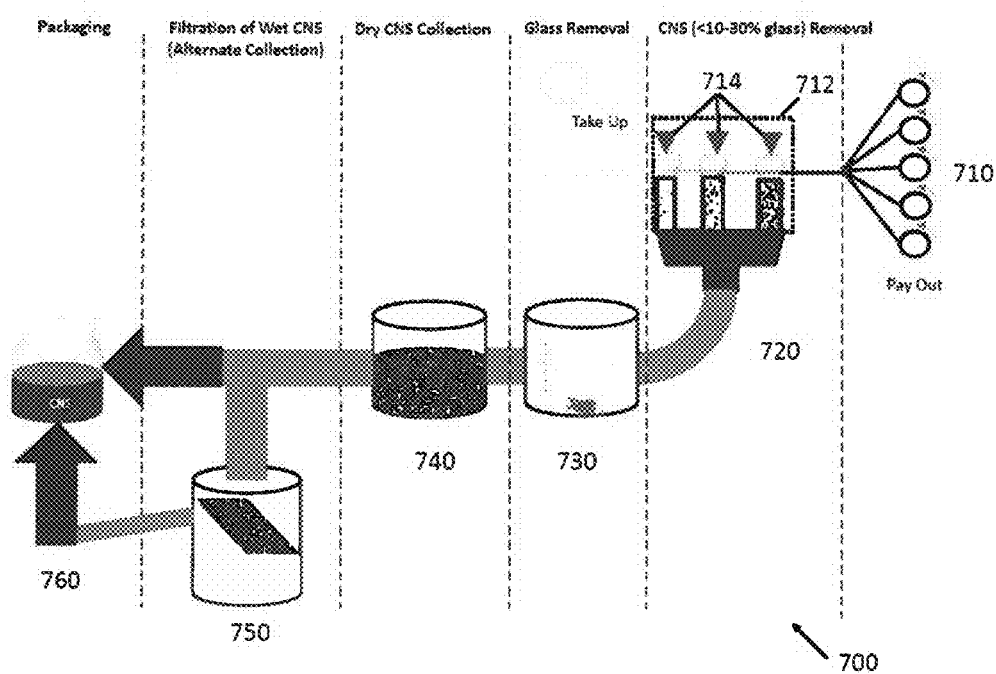
FIG. 8 shows an illustrative schematic further elaborating on the process demonstrated in FIG. 7.

FIG. 8 shows an illustrative schematic further elaborating on the process demonstrated in FIG. 7. As illustrated in process 700 of FIG. 8, a single spool or multiple spools of a carbon nanostructure-laden fiber-type substrate is fed in operation 710 to removal chamber 712 using a pay-out and take-up system. Removal of the carbon nanostructures from the fiber-type substrate can be affected with a single or several pressurized air source tools 714, such as an air knife or air nozzle at operation 720. Such air source tools can be placed generally perpendicular to the spool(s), and the air can then be directed on to the fiber-type substrate carrying the carbon nanostructures. In some embodiments, the air source tool can be stationary, while in other embodiments, the air source tool can be movable. In embodiments where the air source tool is movable, it can be configured to oscillate with respect to the surface of the fiber-type substrate to improve the removal efficiency. Upon air impact, fiber tows and other bundled fiber-type substrates can be spread, thereby exposing additional surface area on the substrate and improving removal of the carbon nanostructures, while advantageously avoiding mechanical contact. In some embodiments, the integrity of the substrate can be sufficient to recycle the substrate in a continuous cycle of carbon nanostructure synthesis and removal. Thus, in some embodiments, the substrate can be in the form of a belt or a loop in which carbon nanostructures are synthesized on the substrate, subsequently removed downstream, and then recycled for additional growth of new carbon nanostructures in the location where the original carbon nanostructures were removed. In some embodiments, removal of the original carbon nanostructures can result in removal of the surface treatment that facilitated carbon nanostructure removal. Thus, in some embodiments, the substrate can again be modified after removal of the original carbon nanostructures to promote removal of the new carbon nanostructures, as generally performed according to the surface modification techniques described herein. The surface treatment performed on the substrate after the original carbon nanostructures are removed can be the same or different as the original surface treatment.

In some embodiments, the integrity of the substrate can be compromised during carbon nanostructure removal, and at least a portion of the substrate can become admixed with the carbon nanostructures while no longer being adhered thereto. Referring still to FIG. 8, fragmented substrate that has become admixed with the isolated carbon nanostructures can be removed in operation 730. In FIG. 8, operation 730 is depicted as taking place by cyclonic filtration, but any suitable solids separation technique can be used. For example, in some embodiments, sieving, differential settling, or other size-based separations can be performed. In other embodiments, density-based separations can be performed. In still other embodiments, a chemical reaction may be used, at least in part, to affect separation of the carbon nanostructures from growth substrate that is not adhered to the carbon nanostructures. Although FIG. 8 has depicted a single cyclonic filtration, multiple vacuum and cyclonic filtration techniques can be used in series, parallel, or any combination thereof to remove residual fragmented growth substrate from the carbon nanostructures. Such techniques can employ multiple stages of filter media and/or filtration rates to selectively capture the fragmented growth substrate while allowing the carbon nanostructures to pass to a collection vessel. The resultant carbon nanostructures can be either collected dry at operation 740 or collected as a wet sludge at operation 750. In some embodiments, the carbon nanostructures can be processed directly following the removal of fragmented growth substrate in operation 730 and packed into a storage vessel or shippable container in packaging operation 760. Otherwise, packaging can follow dry collection operation 740 or wet collection operation 750.

In embodiments where wet processing is employed, the carbon nanostructures can be mixed with about 1% to about 40% solvent in water and passed through a filter or like separation mechanism to separate the carbon nanostructures from the solvent. The resultant separated carbon nanostructures can be dried and packed or stored "wet" as a dispersion in a fluid phase. It has been observed that unlike individualized carbon nanotube solutions or dispersions, carbon nanostructures can advantageously form stable dispersions. In some embodiments, stable dispersions can be achieved in the absence of stabilizing surfactants, even with water as solvent. In some or other embodiments, a solvent can be used in combination with water during wet processing. Suitable solvents for use in conjunction with wet processing can include, but are not limited to, isopropanol (IPA), ethanol, methanol, and water.

Figure 9:
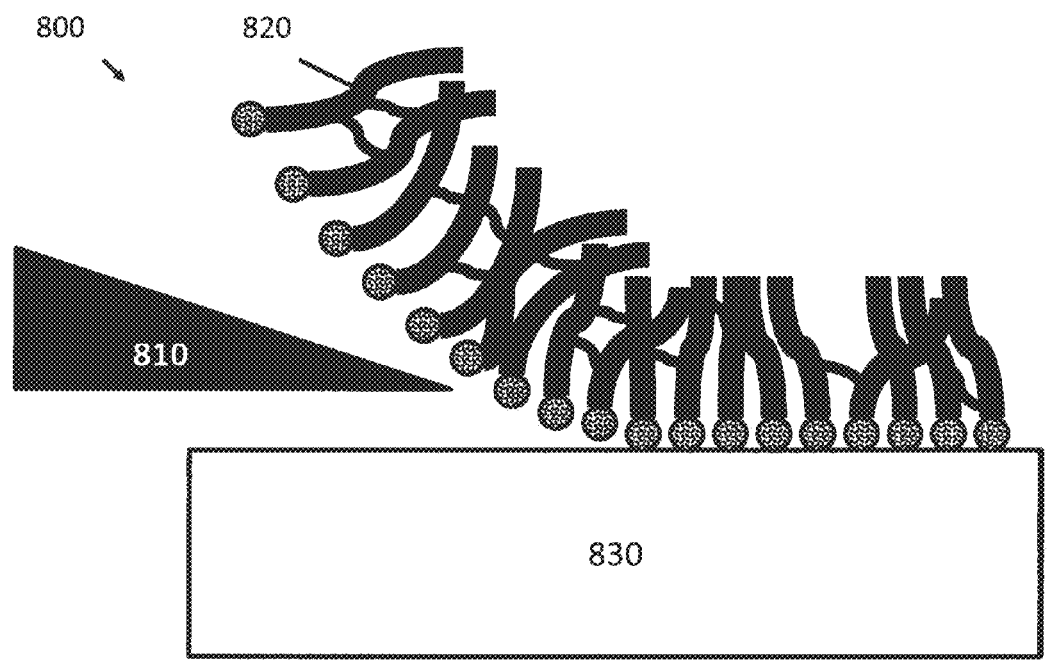
FIG. 9 shows an illustrative schematic demonstrating how mechanical shearing can be used to remove carbon nanostructures and a transition metal nanoparticle catalyst from a growth substrate.

As an alternative to fluid shearing, mechanical shearing can be used to remove the carbon nanostructures from the growth substrate in some embodiments. FIG. 9 shows an illustrative schematic demonstrating how mechanical shearing can be used to remove carbon nanostructures and a transition metal nanoparticle catalyst from a growth substrate. As shown in FIG. 9, carbon nanostructure removal process 800 can employ mechanical shearing force 810 to remove both the carbon nanostructures and the transition metal nanoparticle catalyst from growth substrate 830 as monolithic entity 820. In some such embodiments, sizing and/or additional anti-adhesive coatings can be employed to limit carbon nanostructure and/or nanoparticle adhesion to the growth substrate, thereby allowing mechanical shear or another type of shearing force to facilitate removal of the carbon nanostructures from the growth substrate. In some embodiments, mechanical shear can be provided by grinding the carbon nanostructure-infused fiber with dry ice.

As another alternative to fluid shearing, in some embodiments, sonication can be used to remove the carbon nanostructures from the growth substrate.

Figure 10:
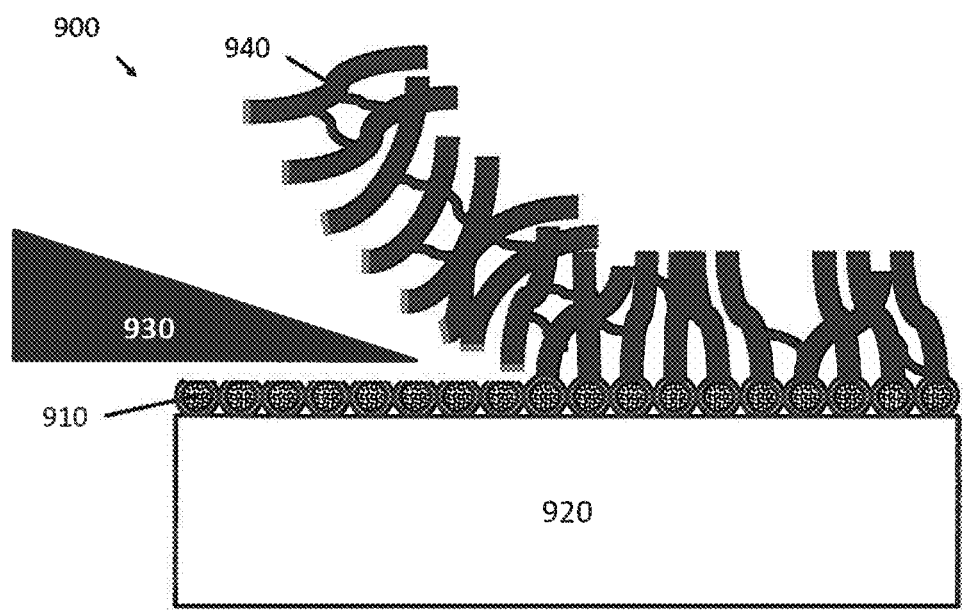
FIG. 10 shows an illustrative schematic demonstrating a carbon nanostructure removal process in which carbon nanostructures can be isolated from a growth substrate absent a transition metal nanoparticle catalyst.

In some embodiments, the carbon nanostructures can be removed from the growth substrate without substantially removing the transition metal nanoparticle catalyst. FIG. 10 shows an illustrative schematic demonstrating carbon nanostructure removal process 900 in which carbon nanostructures can be isolated from a growth substrate absent a transition metal nanoparticle catalyst. As shown in FIG. 10, carbon nanostructures 940 can be grown on growth substrate 920 using implanted transition metal nanoparticle catalyst 910. Thereafter, shear removal 930 of carbon nanostructures 940 leaves transition metal nanoparticle catalyst 910 behind on growth substrate 920. In some such embodiments, a layered catalyst can promote adhesion to the substrate surface, while decreasing carbon nanostructure to nanoparticle adhesion.

Although FIGS. 9 and 10 have depicted carbon nanostructure growth as taking place with basal growth from the catalyst, the skilled artisan will recognize that other mechanistic forms of carbon nanostructure growth are possible. For example, carbon nanostructure growth can also take place such that the catalyst resides distal to the growth substrate on the surface of the carbon nanostructure (i.e., tip growth) or somewhere between tip growth and basal growth. In some embodiments, predominantly basal growth can be selected to aid in carbon nanostructure removal from the growth substrate.

In alternative embodiments, removal of the carbon nanostructures from the growth substrate can take place by a process other than fluid shearing or mechanical shearing. In some embodiments, chemical etching can be used to remove the carbon nanostructures from the growth substrate. In some embodiments, the transition metal nanoparticle catalyst used to promote carbon nanostructure growth can be a transition metal salt containing an anion that is selected to etch the growth substrate, thereby facilitating removal of the carbon nanostructures. Suitable etching anions can include, for example, chlorides, sulfates, nitrates, nitrites, and fluorides. In some or other embodiments, a chemical etch can be employed independently from the catalyst choice. For example, when employing a glass substrate, a hydrogen fluoride etch can be used to weaken adherence of the carbon nanostructures and/or the transition metal nanoparticle catalyst to the substrate.

The carbon nanostructures disclosed herein comprise carbon nanotubes (CNTs) in a network having a complex structural morphology, which has been described in more detail hereinabove. Without being bound by any theory or mechanism, it is believed that this complex structural morphology results from the preparation of the carbon nanostructures on a substrate under CNT growth conditions that produce a rapid growth rate on the order of several microns per second. The rapid CNT growth rate, coupled with the close proximity of the CNTs to one another, can confer the observed branching, crosslinking, and shared wall motifs to the CNTs. In the discussion that follows, techniques for producing carbon nanostructures bound to a fiber substrate are described. For simplicity, the discussion may refer to the carbon nanostructures disposed on the substrate interchangeably as CNTs, since CNTs represent the major structural component of carbon nanostructures.

In some embodiments, the processes disclosed herein can be applied to nascent fiber materials generated de novo before, or in lieu of, application of a typical sizing solution to the fiber material. Alternatively, the processes disclosed herein can utilize a commercial fiber material, for example, a tow, that already has a sizing applied to its surface. In such embodiments, the sizing can be removed to provide a direct interface between the fiber material and the synthesized carbon nanostructure, although a transition metal nanoparticle catalyst can serve as an intermediate linker between the two. After carbon nanostructure synthesis, further sizing agents can be applied to the fiber material as desired. For the purpose of carbon nanostructure isolation, any of the above mentioned sizing or coatings can be employed to facilitate the isolation process. Equally suitable substrates for forming carbon nanostructures include tapes, sheets and even three dimensional forms which can be used to provide a shaped carbon nanostructure product. The processes described herein allow for the continuous production of CNTs that make up the carbon nanostructure network having uniform length and distribution along spoolable lengths of tow, tapes, fabrics and other 3D woven structures.

As used herein the term "fiber material" refers to any material which has fiber as its elementary structural component. The term encompasses fibers, filaments, yarns, tows, tows, tapes, woven and non-woven fabrics, plies, mats, and the like.

As used herein the term "spoolable dimensions" refers to fiber materials having at least one dimension that is not limited in length, allowing for the material to be stored on a spool or mandrel. Processes of described herein can operate readily with 5 to 20 lb. spools, although larger spools are usable. Moreover, a pre-process operation can be incorporated that divides very large spoolable lengths, for example 100 lb. or more, into easy to handle dimensions, such as two 50 lb. spools.

As used herein, the term "carbon nanotube" (CNT, plural CNTs) refers to any of a number of cylindrically-shaped allotropes of carbon of the fullerene family including single-walled carbon nanotubes (SWNTs), double-walled carbon nanotubes (DWNTs), multi-walled carbon nanotubes (MWNTs). CNTs can be capped by a fullerene-like structure or open-ended. CNTs include those that encapsulate other materials. CNTs can appear in branched networks, entangled networks, and combinations thereof. The CNTs prepared on the substrate and forming carbon nanostructures can include individual CNT motifs from exclusive MWNTs, SWNTs, or DWNTs, or the carbon nanostructures can include mixtures of these CNT motifs.

As used herein "uniform in length" refers to an average length of CNTs grown in a reactor for producing carbon nanostructures. "Uniform length" means that the CNTs have lengths with tolerances of plus or minus about 20% of the total CNT length or less, for CNT lengths varying from between about 1 micron to about 500 microns. At very short lengths, such as 1-4 microns, this error may be in a range from between about plus or minus 20% of the total CNT length up to about plus or minus 1 micron, that is, somewhat more than about 20% of the total CNT length. In the context of carbon nanostructures, at least one dimension of the carbon nanostructures can be controlled by the length of the CNTs grown.

As used herein "uniform in distribution" refers to the consistency of density of CNTs on a growth substrate, such as a fiber material. "Uniform distribution" means that the CNTs have a density on the fiber material with tolerances of plus or minus about 10% coverage defined as the percentage of the surface area of the fiber covered by CNTs. This is equivalent to ±1500 CNTs/$\mu m^2$ for an 8 nm diameter CNT with 5 walls. Such a figure assumes the space inside the CNTs as fillable.

As used herein, the term "transition metal" refers to any element or alloy of elements in the d-block of the periodic table. The term "transition metal" also includes salt forms of the base transition metal element such as oxides, carbides, nitrides, and the like.

As used herein, the term "nanoparticle" or NP (plural NPs), or grammatical equivalents thereof refers to particles sized between about 0.1 to about 100 nanometers in equivalent spherical diameter, although the NPs need not be spherical in shape. Transition metal NPs, in particular, can serve as catalysts for CNT growth on the fiber materials.

As used herein, the term "sizing agent," "fiber sizing agent," or just "sizing," refers collectively to materials used in the manufacture of fibers as a coating to protect the integrity of fibers, provide enhanced interfacial interactions between a fiber and a matrix material in a composite, and/or alter and/or enhance particular physical properties of a fiber.

As used herein, the term "material residence time" refers to the amount of time a discrete point along a fiber material of spoolable dimensions is exposed to CNT growth conditions during the CNS processes described herein. This definition includes the residence time when employing multiple CNT growth chamber.

As used herein, the term "linespeed" refers to the speed at which a fiber material of spoolable dimensions is fed through the CNT synthesis processes described herein, where linespeed is a velocity determined by dividing CNT chamber(s)' length by the material residence time.

In some embodiments, the CNT-laden fiber material includes a fiber material of spoolable dimensions and carbon nanotubes (CNTs) in the form of carbon nanostructures grown on the fiber material.

Without being bound by any theory or mechanism, transition metal NPs, which serve as a CNT-forming catalyst, can catalyze CNT growth by forming a CNT growth seed structure. In one embodiment, the CNT-forming catalyst can remain at the base of the fiber material (i.e., basal growth). In such a case, the seed structure initially formed by the transition metal nanoparticle catalyst is sufficient for continued non-catalyzed seeded CNT growth without allowing the catalyst to move along the leading edge of CNT growth (i.e., tip growth). In such a case, the NP serves as a point of attachment for the CNS to the fiber material.

Compositions having CNS-laden fiber materials are provided in which the CNTs are substantially uniform in length. In the continuous process described herein, the residence time of the fiber material in a CNT growth chamber can be modulated to control CNT growth and ultimately, CNT and CNS length. These features provide a means to control specific properties of the CNTs grown and hence the properties of the CNS. CNT length can also be controlled through modulation of the carbon feedstock and carrier gas flow rates and reaction temperature. Additional control of the CNT properties can be obtained by modulating, for example, the size of the catalyst used to prepare the CNTs. For example, 1 nm transition metal nanoparticle catalysts can be used to provide SWNTs in particular. Larger catalysts can be used to prepare predominantly MWNTs.

Additionally, the CNT growth processes employed are useful for providing a CNS-laden fiber material with uniformly distributed CNTs while avoiding bundling and/or aggregation of the CNTs that can occur in processes in which preformed CNTs are suspended or dispersed in a solvent medium and applied by hand to the fiber material. In some embodiments, the maximum distribution density, expressed as percent coverage, that is, the surface area of fiber material that is covered, can be as high as about 55% assuming about 8 nm diameter CNTs with 5 walls. This coverage is calculated by considering the space inside the CNTs as being "fillable" space. Various distribution/density values can be achieved by varying catalyst dispersion on the surface as well as controlling gas composition and process speed. Typically for a given set of parameters, a percent coverage within about 10% can be achieved across a fiber surface. Higher density and shorter CNTs (e.g., less than about 100 microns in length) can be useful for improving mechanical properties, while longer CNTs (e.g., greater than about 100 microns in length) with lower density can be useful for improving thermal and electrical properties, although increased density still can be favorable. A lower density can result when longer CNTs are grown. This can be the result of the higher temperatures and more rapid growth causing lower catalyst particle yields.

CNS-laden fiber materials can include a fiber material such as filaments, a fiber yarn, a fiber tow, a fiber-braid, a woven fabric, a non-woven fiber mat, a fiber ply, and other 3D woven structures. Filaments include high aspect ratio fibers having diameters ranging in size from between about 1 micron to about 100 microns. Fiber tows are generally compactly associated bundles of filaments and are usually twisted together to give yarns.

Yarns include closely associated bundles of twisted filaments. Each filament diameter in a yarn is relatively uniform. Yarns have varying weights described by their 'tex,' expressed as weight in grams of 1000 linear meters, or denier, expressed as weight in pounds of 10,000 yards, with a typical tex range usually being between about 200 tex to about 2000 tex.

Tows include loosely associated bundles of untwisted filaments. As in yarns, filament diameter in a tow is generally uniform. Tows also have varying weights and the tex range is usually between 200 tex and 2000 tex. They are frequently characterized by the number of thousands of filaments in the tow, for example 12K tow, 24K tow, 48K tow, and the like.

Tapes are materials that can be assembled as weaves or can represent non-woven flattened tows. Tapes can vary in width and are generally two-sided structures similar to ribbon. CNT infusion can take place on one or both sides of a tape. CNS-laden tapes can resemble a "carpet" or "forest" on a flat substrate surface. However, the CNS can be readily distinguished from conventional aligned CNT forests due to the significantly higher degree of branching and crosslinking that occurs in the CNS structural morphology. Again, processes described herein can be performed in a continuous mode to functionalize spools of tape.

Fiber braids represent rope-like structures of densely packed fibers. Such structures can be assembled from yarns, for example. Braided structures can include a hollow portion or a braided structure can be assembled about another core material.

CNTs lend their characteristic properties such as mechanical strength, low to moderate electrical resistivity, high thermal conductivity, and the like to the CNS-laden fiber material. For example, in some embodiments, the electrical resistivity of a carbon nanotube-laden fiber material is lower than the electrical resistivity of a parent fiber material. Likewise, such properties can translate to the isolated CNS. More generally, the extent to which the resulting CNS-laden fiber expresses these characteristics can be a function of the extent and density of coverage of the fiber by the carbon nanotubes. Any amount of the fiber surface area, from 0-55% of the fiber can be covered assuming an 8 nm diameter, 5-walled MWNT (again this calculation counts the space inside the CNTs as fillable). This number is lower for smaller diameter CNTs and more for greater diameter CNTs. 55% surface area coverage is equivalent to about 15,000 CNTs/micron$^2$. Further CNT properties can be imparted to the fiber material in a manner dependent on CNT length, as described above. CNTs within the carbon nanostructures can vary in length from between about 1 micron to about 500 microns, including about 1 micron, about 2 microns, about 3 microns, about 4 micron, about 5, microns, about 6, microns, about 7 microns, about 8 microns, about 9 microns, about 10 microns, about 15 microns, about 20 microns, about 25 microns, about 30 microns, about 35 microns, about 40 microns, about 45 microns, about 50 microns, about 60 microns, about 70 microns, about 80 microns, about 90 microns, about 100 microns, about 150 microns, about 200 microns, about 250 microns, about 300 microns, about 350 microns, about 400 microns, about 450 microns, about 500 microns, and all values and sub-ranges in between. CNTs can also be less than about 1 micron in length, including about 0.5 microns, for example. CNTs can also be greater than 500 microns, including for example, about 510 microns, about 520 microns, about 550 microns, about 600 microns, about 700 microns and all values and subranges in between. It will be understood that such lengths accommodate the presence of crosslinking and branching and therefore the length may be the composite length measured from the base of the growth substrate up to the edges of the CNS.

CNSs described herein can also incorporate CNTs have a length from about 1 micron to about 10 microns. Such CNT lengths can be useful in application to increase shear strength. CNTs can also have a length from about 5 to about 70 microns. Such CNT lengths can be useful in applications for increased tensile strength if the CNTs are aligned in the fiber direction. CNTs can also have a length from about 10 microns to about 100 microns. Such CNT lengths can be useful to increase electrical/thermal properties as well as mechanical properties. CNTs having a length from about 100 microns to about 500 microns can also be beneficial to increase electrical and thermal properties. Such control of CNT length is readily achieved through modulation of carbon feedstock and inert gas flow rates coupled with varying linespeeds and growth temperatures.

In some embodiments, compositions that include spoolable lengths of CNS-laden fiber materials can have various uniform regions with different lengths of CNTs. For example, it can be desirable to have a first portion of CNS-laden fiber material with uniformly shorter CNT lengths to enhance shear strength properties, and a second portion of the same spoolable material with a uniform longer CNT length to enhance electrical or thermal properties.

Processes for rapid CNS growth on fiber materials allow for control of the CNT lengths with uniformity in continuous processes with spoolable fiber materials. With material residence times between 5 to 300 seconds, linespeeds in a continuous process for a system that is 3 feet long can be in a range anywhere from about 0.5 ft/min to about 36 ft/min and greater. The speed selected depends on various parameters as explained further below.

In some embodiments, a material residence time of about 5 seconds to about 30 seconds can produce CNTs having a length between about 1 micron to about 10 microns. In some embodiments, a material residence time of about 30 seconds to about 180 seconds can produce CNTs having a length between about 10 microns to about 100 microns. In still further embodiments, a material residence time of about 180 seconds to about 300 seconds can produce CNTs having a length between about 100 microns to about 500 microns. One skilled in the art will recognize that these ranges are approximate and that CNT length can also be modulated by reaction temperatures, and carrier and carbon feedstock concentrations and flow rates.

In some embodiments, continuous processes for CNS growth can include (a) disposing a carbon nanotube-forming catalyst on a surface of a fiber material of spoolable dimensions; and (b) synthesizing carbon nanotubes directly on the fiber material, thereby forming a CNS-laden fiber material. For a 9 foot long system, the linespeed of the process can range from between about 1.5 ft/min to about 108 ft/min. The linespeeds achieved by the process described herein allow the formation of commercially relevant quantities of CNS-laden fiber materials with short production times. For example, at 36 ft/min linespeed, the quantities of CNS-laden fibers (over 5% CNTs on fiber by weight) can exceed over 100 pound or more of material produced per day in a system that is designed to simultaneously process 5 separate tows (20 lb/tow). Systems can be made to produce more tows at once or at faster speeds by repeating growth zones.

As described further below the catalyst can be prepared as a liquid solution that contains CNT-forming catalyst that contains transition metal nanoparticles. The diameters of the synthesized nanotubes are related to the size of the transition metal nanoparticles as described above. In some embodiments, commercial dispersions of CNT-forming transition metal nanoparticle catalysts are available and can be used without dilution, and in other embodiments commercial dispersions of catalyst can be diluted. Whether to dilute such solutions can depend on the desired density and length of CNT to be grown as described above.

Carbon nanotube synthesis can be based on a chemical vapor deposition (CVD) process and occurs at elevated temperatures. The specific temperature is a function of catalyst choice, but will typically be in a range of about 500° C. to about 1000° C. This operation involves heating the fiber material to a temperature in the aforementioned range to support carbon nanotube synthesis.

CVD-promoted nanotube growth on the catalyst-laden fiber material is then performed. The CVD process can be promoted by, for example, a carbon-containing feedstock gas such as acetylene, ethylene, methane, and/or propane. The CNT synthesis processes generally use an inert gas (nitrogen, argon, helium) as a primary carrier gas. The carbon feedstock is generally provided in a range from between about 0% to about 50% of the total mixture. A substantially inert environment for CVD growth is prepared by removal of moisture and oxygen from the growth chamber.

The operation of disposing a catalyst on the fiber material can be accomplished by spraying or dip coating a solution or by gas phase deposition via, for example, a plasma process. Thus, in some embodiments, after forming a solution of a catalyst in a solvent, catalyst can be applied by spraying or dip coating the fiber material with the solution, or combinations of spraying and dip coating. Either technique, used alone or in combination, can be employed once, twice, thrice, four times, up to any number of times to provide a fiber material that is sufficiently uniformly coated with CNT-forming catalyst. When dip coating is employed, for example, a fiber material can be placed in a first dip bath for a first residence time in the first dip bath. When employing a second dip bath, the fiber material can be placed in the second dip bath for a second residence time. For example, fiber materials can be subjected to a solution of CNT-forming catalyst for between about 3 seconds to about 90 seconds depending on the dip configuration and linespeed. Employing spraying or dip coating processes, a fiber material with a surface density of catalyst of less than about 5% surface coverage to as high as about 80% coverage, in which the CNT-forming catalyst nanoparticles are nearly monolayer. In some embodiments, the process of coating the CNT-forming catalyst on the fiber material should produce no more than a monolayer. For example, CNT growth on a stack of CNT-forming catalyst can erode the degree of infusion of the CNT to the fiber material. In other embodiments, the transition metal catalyst can be deposited on the fiber material using evaporation techniques, electrolytic deposition techniques, and other deposition processes, such as addition of the transition metal catalyst to a plasma feedstock gas as a metal organic, metal salt or other composition promoting gas phase transport.

Because processes for growing carbon nanostructures are designed to be continuous, a spoolable fiber material can be dip-coated in a series of baths where dip coating baths are spatially separated. In continuous processes in which nascent fibers are being generated de novo, dip bath or spraying of CNT-forming catalyst can be the first step. In other embodiments, the CNT-forming catalyst can be applied to newly formed fibers in the presence of other sizing agents. Such simultaneous application of CNT-forming catalyst and other sizing agents can provide the CNT-forming catalyst in the surface of the sizing on the fiber material to create a poorly adhered CNT coating.

The catalyst solution employed can be a transition metal nanoparticle which can be any d-block transition metal, as described above. In addition, the nanoparticles can include alloys and non-alloy mixtures of d-block metals in elemental form or in salt form, and mixtures thereof. Such salt forms include, without limitation, oxides, carbides, acetates, and nitrides. Non-limiting exemplary transition metal NPs include Ni, Fe, Co, Mo, Cu, Pt, Au, and Ag and salts thereof and mixtures thereof. In some embodiments, such CNT-forming catalysts are disposed on the fiber by applying or infusing a CNT-forming catalyst directly to the fiber material simultaneously with barrier coating deposition. Many of these transition metal catalysts are readily commercially available from a variety of suppliers, including, for example, Sigma Aldrich (St. Louis, Mo.) or Ferrotec Corporation (Bedford, N.H.).

Catalyst solutions used for applying the CNT-forming catalyst to the fiber material can be in any common solvent that allows the CNT-forming catalyst to be uniformly dispersed throughout. Such solvents can include, without limitation, water, acetone, hexane, isopropyl alcohol, toluene, ethanol, methanol, tetrahydrofuran (THF), cyclohexane or any other solvent with controlled polarity to create an appropriate dispersion of the CNT-forming catalyst nanoparticles. Concentrations of CNT-forming catalyst can be in a range from about 1:1 to 1:10000 catalyst to solvent. Such concentrations can be used when the barrier coating and CNT-forming catalyst are applied simultaneously as well.

In some embodiments heating of the fiber material can be at a temperature that is between about 500° C. and about 1000° C. to synthesize carbon nanotubes after deposition of the CNT-forming catalyst. Heating at these temperatures can be performed prior to or substantially simultaneously with introduction of a carbon feedstock for CNT growth.

In some embodiments, the processes for producing a carbon nanostructure include removing a sizing agent from a fiber material, applying an adhesion-inhibiting coating (i.e., an anti-adhesive coating) conformally over the fiber material, applying a CNT-forming catalyst to the fiber material, heating the fiber material to at least 500° C., and synthesizing carbon nanotubes on the fiber material. In some embodiments, operations of the CNS-growth process can include removing sizing from a fiber material, applying an adhesion-inhibiting coating to the fiber material, applying a CNT-forming catalyst to the fiber, heating the fiber to CNT-synthesis temperature and performing CVD-promoted CNS growth on the catalyst-laden fiber material. Thus, where commercial fiber materials are employed, processes for constructing CNS-laden fibers can include a discrete step of removing sizing from the fiber material before disposing adhesion-inhibiting coating and the catalyst on the fiber material.

Synthesizing carbon nanotubes on the fiber material can include numerous techniques for forming carbon nanotubes, including those disclosed in co-pending U.S. Patent Application Publication No. 2004/0245088, which is incorporated herein by reference. The CNS grown on the fibers can be formed by techniques such as, for example, micro-cavity, thermal or plasma-enhanced CVD techniques, laser ablation, arc discharge, and high pressure carbon monoxide (HiPCO). In some embodiments, any conventional sizing agents can be removed prior CNT synthesis. In some embodiments, acetylene gas can be ionized to create a jet of cold carbon plasma for CNT synthesis. The plasma is directed toward the catalyst-bearing fiber material. Thus, in some embodiments for synthesizing CNS on a fiber material include (a) forming a carbon plasma; and (b) directing the carbon plasma onto the catalyst disposed on the fiber material. The diameters of the CNTs that are grown are dictated by the size of the CNT-forming catalyst as described above. In some embodiments, the sized fiber material is heated to between about 550° C. to about 800° C. to facilitate CNS synthesis. To initiate the growth of CNTs, two gases are bled into the reactor: a process gas such as argon, helium, or nitrogen, and a carbon-containing gas, such as acetylene, ethylene, ethanol or methane. CNTs grow at the sites of the CNT-forming catalyst.

In some embodiments, the CVD growth is plasma-enhanced. A plasma can be generated by providing an electric field during the growth process. CNTs grown under these conditions can follow the direction of the electric field. Thus, by adjusting the geometry of the reactor, vertically aligned carbon nanotubes can be grown radially about a cylindrical fiber. In some embodiments, a plasma is not required for radial growth about the fiber. For fiber materials that have distinct sides such as tapes, mats, fabrics, plies, and the like, catalyst can be disposed on one or both sides and correspondingly, CNTs can be grown on one or both sides as well.

As described above, CNS-synthesis can be performed at a rate sufficient to provide a continuous process for functionalizing spoolable fiber materials. Numerous apparatus configurations facilitate such continuous synthesis and result in the complex CNS morphology, as exemplified below.

One configuration for continuous CNS synthesis involves an optimally shaped (shaped to match the size and shape of the substrate) reactor for the synthesis and growth of carbon nanotubes directly on fiber materials. The reactor can be designed for use in a continuous in-line process for producing CNS-bearing fibers. In some embodiments, CNSs can be grown via a chemical vapor deposition ("CVD") process at atmospheric pressure and at elevated temperature in the range of about 550° C. to about 800° C. in a multi-zone reactor. The fact that the synthesis occurs at atmospheric pressure is one factor that facilitates the incorporation of the reactor into a continuous processing line for CNS-on-fiber synthesis. Another advantage consistent with in-line continuous processing using such a zoned reactor is that CNT growth occurs in a seconds, as opposed to minutes (or longer) as in other procedures and apparatus configurations typical in the art.

CNS synthesis reactors in accordance with the various embodiments include the following features:

Optimally Shaped Synthesis Reactors: Adjusting the size of the growth chamber to more effectively match the size of the substrate traveling through it improves reaction rates as well as process efficiency by reducing the overall volume of the reaction vessel. The cross section of the optimally shaped growth chamber can be maintained below a volume ratio of chamber to substrate of 10,000. In some embodiments, the cross section of the chamber is maintained at a volume ratio of below 1,000. In other embodiments, the cross section of the chamber is maintained at a volume ratio below 500.

Although gas deposition processes, such as CVD, are typically governed by pressure and temperature alone, volume has a significant impact on the efficiency of deposition. By matching the shape of the substrate with the growth chamber there is greater opportunity for productive CNS forming reactions to occur. It should be appreciated that in some embodiments, the synthesis reactor has a cross section that is described by polygonal forms according the shape of the substrate upon which the CNS is grown to provide a reduction in reactor volume. In some embodiments, gas can be introduced at the center of the reactor or within a target growth zone, symmetrically, either through the sides or through the top and bottom plates of the reactor. This improves the overall CNT growth rate because the incoming feedstock gas is continuously replenishing at the hottest portion of the system, which is where CNT growth is most active. This constant gas replenishment is an important aspect to the increased growth rate exhibited by the shaped CNT reactors.

Zoning: Chambers that provide a relatively cool purge zone depend from both ends of the synthesis reactor. Applicants have determined that if hot gas were to mix with the external environment (i.e., outside of the reactor), there would be an increase in degradation of most fiber materials. The cool purge zones provide a buffer between the internal system and external environments. Typical CNT synthesis reactor configurations known in the art typically require that the substrate is carefully (and slowly) cooled. The cool purge zone at the exit of the present CNS growth reactor achieves the cooling in a short period of time, as required for the continuous in-line processing.

Non-contact, hot-walled, metallic reactor: In some embodiments, a hot-walled reactor made of metal can be employed, in particular stainless steel. This may appear counterintuitive because metal, and stainless steel in particular, is more susceptible to carbon deposition (i.e., soot and by-product formation). Thus, most CNT reactor configurations use quartz reactors because there is less carbon deposited, quartz is easier to clean, and quartz facilitates sample observation.

However, it has been observed that the increased soot and carbon deposition on stainless steel results in more consistent, faster, more efficient, and more stable CNT growth. Without being bound by theory it has been indicated that, in conjunction with atmospheric operation, the CVD process occurring in the reactor is diffusion limited. That is, the catalyst is "overfed;" too much carbon is available in the reactor system due to its relatively higher partial pressure (than if the reactor was operating under partial vacuum). As a consequence, in an open system—especially a clean one—too much carbon can adhere to catalyst particles, compromising their ability to synthesize CNTs. In some embodiments, the rectangular reactor is intentionally run when the reactor is "dirty," that is with soot deposited on the metallic reactor walls. Once carbon deposits to a monolayer on the walls of the reactor, carbon will readily deposit over itself. Since some of the available carbon is "withdrawn" due to this mechanism, the remaining carbon feedstock, in the form of radicals, react with the catalyst at a rate that does not poison the catalyst. Existing systems run "cleanly" which, if they were open for continuous processing, would produce a much lower yield of CNTs at reduced growth rates.

Although it is generally beneficial to perform CNT synthesis "dirty" as described above, certain portions of the apparatus, such as gas manifolds and inlets, can nonetheless negatively impact the CNT growth process when soot created blockages. In order to combat this problem, such areas of the CNT growth reaction chamber can be protected with soot inhibiting coatings such as silica, alumina, or MgO. In practice, these portions of the apparatus can be dip-coated in these soot inhibiting coatings. Metals such as INVAR® can be used with these coatings as INVAR has a similar CTE (coefficient of thermal expansion) ensuring proper adhesion of the coating at higher temperatures, preventing the soot from significantly building up in critical zones.

In some embodiments, the reaction chamber may comprise SiC, alumina, or quartz as the primary chamber materials because they do not react with the reactive gases of CNS synthesis. This feature allows for increased efficiency and improves operability over long durations of operation.

Combined Catalyst Reduction and CNS Synthesis. In the CNT synthesis reactor, both catalyst reduction and CNS growth can occur within the reactor. This feature is significant because the reduction operation cannot be accomplished timely enough for use in a continuous process if performed as a discrete operation. In typical carbon nanotube synthesis processes, catalyst reduction typically takes 1-12 hours to perform. In synthesizing a carbon nanostructure according to the embodiments described herein, both catalyst reduction and CNS synthesis occur in the reactor, at least in part, due to the fact that carbon feedstock gas is introduced at the center of the reactor, not the end as would typically be performed using cylindrical reactors. The reduction process occurs as the fibers enter the heated zone; by this point, the gas has had time to react with the walls and cool off prior to reacting with the catalyst and causing the oxidation-reduction (via hydrogen radical interactions). It is this transition region where the reduction occurs. At the hottest isothermal zone in the system, the CNS growth occurs, with the greatest growth rate occurring proximal to the gas inlets near the center of the reactor.

In some embodiments, when loosely affiliated fiber materials, such as tow are employed, the continuous process can include operations that spreads out the strands and/or filaments of the tow. Thus, as a tow is unspooled it can be spread using a vacuum-based fiber spreading system, for example. When employing sized fibers, which can be relatively stiff, additional heating can be employed in order to "soften" the tow to facilitate fiber spreading. The spread fibers which comprise individual filaments can be spread apart sufficiently to expose an entire surface area of the filaments, thus allowing the tow to more efficiently react in subsequent process steps. Such spreading can approach between about 4 inches to about 6 inches across for a 3 k tow. The spread tow can pass through a surface treatment step that is composed of a plasma system as described above. After a barrier coating is applied and roughened, spread fibers then can pass through a CNT-forming catalyst dip bath. The result is fibers of the tow that have catalyst particles distributed radially on their surface. The catalyzed-laden fibers of the tow then enter an appropriate CNT growth chamber, such as the optimally shaped chamber described above, where a flow through atmospheric pressure CVD or PE-CVD process is used to synthesize the CNS at rates as high as several microns per second. The fibers of the tow, now with radially aligned CNTs in the form of the CNS morphology, exit the CNT growth reactor.

In some embodiments, CNS-laden fiber materials can pass through yet another treatment process prior to isolation that, in some embodiments is a plasma process used to functionalize the CNS. Additional functionalization of CNS can be used to promote their adhesion to particular resins. Thus, in some embodiments, the processes can provide CNS-laden fiber materials having functionalized CNS. Completing this functionalization process while the CNS are still on the fiber can improve treatment uniformity.

In some embodiments, a continuous process for growing of CNS on spoolable fiber materials can achieve a linespeed between about 0.5 ft/min to about 36 ft/min. In this embodiment where the CNT growth chamber is 3 feet long and operating at a 750° C. growth temperature, the process can be run with a linespeed of about 6 ft/min to about 36 ft/min to produce, for example, CNTs having a length between about 1 micron to about 10 microns. The process can also be run with a linespeed of about 1 ft/min to about 6 ft/min to produce, for example, CNTs having a length between about 10 microns to about 100 microns. The process can be run with a linespeed of about 0.5 ft/min to about 1 ft/min to produce, for example, CNTs having a length between about 100 microns to about 200 microns. The CNT length is not tied only to linespeed and growth temperature, however, the flow rate of both the carbon feedstock and the inert carrier gases can also influence CNT length. For example, a flow rate consisting of less than 1% carbon feedstock in inert gas at high linespeeds (6 ft/min to 36 ft/min) will result in CNTs having a length between 1 micron to about 5 microns. A flow rate consisting of more than 1% carbon feedstock in inert gas at high linespeeds (6 ft/min to 36 ft/min) will result in CNTs having length between 5 microns to about 10 microns.

In some embodiments, more than one material can be run simultaneously through the process. For example, multiple tapes tows, filaments, strand and the like can be run through the process in parallel. Thus, any number of pre-fabricated spools of fiber material can be run in parallel through the process and re-spooled at the end of the process. The number of spooled fiber materials that can be run in parallel can include one, two, three, four, five, six, up to any number that can be accommodated by the width of the CNT-growth reaction chamber. Moreover, when multiple fiber materials are run through the process, the number of collection spools can be less than the number of spools at the start of the process. In such embodiments, strands, tows, or the like can be sent through a further process of combining such fiber materials into higher ordered fiber materials such as woven fabrics or the like. The continuous process can also incorporate a post processing chopper that facilitates the formation CNS-laden chopped fiber mats, for example.

The continuous processing can optionally include further CNS chemistry. Because the CNS is a polymeric network of CNTs, all the chemistries associated with individualized CNTs may be carried out on the CNS materials. Such chemistries can be performed inline with CNS preparation or separately. In some embodiments, the CNS can be modified while it is still substrate-bound. This can aid in purification of the CNS material. In other embodiments, the CNS chemistry can be performed after it is removed from the substrate upon which it was synthesized. Exemplary chemistries include those described herein above in addition to fluorination, oxidation, reduction, and the like. In some embodiments, the CNS material can be used to store hydrogen. In some embodiments, the CNS structure can be modified by attachment to another polymeric structure to form a diblock polymer. In some embodiments, the CNS structure can be used as a platform for attachment of a biomolecule. In some embodiments, the CNS structure can be configured to be used as a sensor. In some embodiments, the CNS structure can be incorporated in a matrix material to form a composite material. In some embodiments, a CNS structure can be modified with reagents known to unzip CNTs and form graphene nanoribbons. Numerous other chemistries and downstream applications can be recognized by those skilled in the art.

In some embodiments, the processes allow for synthesizing a first amount of a first type of CNS on the fiber material, in which the first type of CNS comprises CNTs selected to alter at least one first property of the fiber material. Subsequently, the processes allow for synthesizing a second amount of a second type of CNS on the fiber material, in which the second type of CNS contains carbon nanotubes selected to alter at least one second property of the fiber material.

In some embodiments, the first amount and second amount of CNTs are different. This can be accompanied by a change in the CNT type or not. Thus, varying the density of CNS can be used to alter the properties of the original fiber material, even if the CNT type remains unchanged. CNT type can include CNT length and the number of walls, for example. In some embodiments the first amount and the second amount are the same. If different properties are desirable along two different stretches of the fiber material, then the CNT type can be changed, such as the CNT length. For example, longer CNTs can be useful in electrical/thermal applications, while shorter CNTs can be useful in mechanical strengthening applications.

Electrical conductivity or specific conductance is a measure of a material's ability to conduct an electric current. CNTs with particular structural parameters such as the degree of twist, which relates to CNT chirality, can be highly conducting, thus exhibiting metallic properties. A recognized system of nomenclature for CNT chirality has been formalized and is recognized by those skilled in the art. Thus, for example, CNTs are distinguished from each other by a double index (n,m) where n and m are integers that describe the cut and wrapping of hexagonal graphite so that it makes a tube when it is wrapped onto the surface of a cylinder and the edges are sealed together. When the two indices are the same, m=n, the resultant tube is said to be of the "arm-chair" (or n,n) type, since when the tube is cut perpendicular to the CNT axis only the sides of the hexagons are exposed and their pattern around the periphery of the tube edge resembles the arm and seat of an arm chair repeated n times. Arm-chair CNTs, in particular SWNTs, are metallic, and have extremely high electrical and thermal conductivity. In addition, such SWNTs have extremely high tensile strength.

In addition to the degree of twist, CNT diameter also effects electrical conductivity. As described above, CNT diameter can be controlled by use of controlled size CNT-forming catalyst nanoparticles. CNTs can also be formed as semi-conducting materials. Conductivity in multi-walled CNTs (MWNTs) can be more complex. Interwall reactions within MWNTs can redistribute current over individual tubes non-uniformly. By contrast, there is no change in current across different parts of metallic single-walled nanotubes (SWNTs). Carbon nanotubes also have very high thermal conductivity, comparable to diamond crystal and in-plane graphite sheets. Any of these characteristic properties of CNTs can be exhibited in a CNS. In some embodiments, the CNS can facilitate realization of property enhancements in materials in which the CNS is incorporated to a degree that is greater than that of individualized CNTs.

EXAMPLES

Example 1

Comparison of Various Carbon Nanostructure-Coated Carbon Fiber Veils to Uncoated Veils An uncoated carbon fiber veil having an areal weight of 8 g/m$^2$, a Ni coated carbon fiber veil having an areal weight of 8 g/m$^2$ and a Cu/Ni coated carbon fiber veil having an areal weight of 11 g/m$^2$ were sourced, and various properties were then measured. Carbon nanostructures were then coated on the fiber veils according to the procedures described hereinabove. Table 3 summarizes testing data for various properties of the fiber veils before and after coating carbon nanostructures thereon.

TABLE 3

| Property | Carbon Fiber Veil Lacking CNS | | | CNS Coated Carbon Fiber Veil | | |
|---|---|---|---|---|---|---|
| | 8 g/m² | Ni Coated 8 g/m² | Cu/Ni Coated 11 g/m² | 8 g/m² | Ni Coated 8 g/m² | Cu/Ni Coated 11 g/m² |
| Thickness (μm) | 76 | 65 | 65 | 77 | 60 | 60 |
| Mass (15 mm diameter) | 1.5 | 1.6 | 1.7 | 2.1 | 2.4 | 2.5 |
| Areal weight (g/m²) | 8.5 | 9.1 | 9.6 | 11.9 | 13.6 | 14.1 |
| In Plane Resistance (Ω/sq) (1" × 1") | 17 | 3.1 | 0.86 | 5.2 | 2.4 | 0.33 |
| Through Plane Resistance (mΩ) (1" × 1" at 10 psi) | 400 | 43 | 45 | 16 | 15 | 7.5 |
| Density (mg/cm³) | 112 | 139 | 148 | 154 | 226 | 236 |
| In Plane Resistivity (mΩ · cm) | 129.2 | 20.15 | 6 | 40 | 14.4 | 2 |
| Through Plane Resistivity at 10 psi (Ω · cm) | 340 | 43 | 45 | 13 | 16 | 8 |
| In Plane Specific Resistivity (mΩ · cm · g/cm³) | 14.4 | 2.8 | 0.8 | 6.2 | 3.3 | 0.5 |
| Through Plane Specific Resistivity (Ω · cm · g/cm³) | 37.9 | 5.9 | 6.6 | 2.1 | 3.7 | 1.9 |
| 11 mm Diameter Roll Linear Resistance (Ω/m) | — | — | — | 189 | 90.6 | 11.8 |
| Calculated CNS Loading (mg/cm²) | — | — | — | 0.34 | 0.45 | 0.45 |

As shown, coating of carbon nanostructures on the carbon fiber veils significantly decreased the resistance and increased the areal weight.

Example 2

Comparative Shielding Effectiveness at 4 GHz

The electromagnetic radiation shielding effectiveness at 4 GHz for an illustrative carbon nanostructure-coated carbon fiber veil was compared under comparable measurement conditions to a number of commercial or non-commercial electromagnetic radiation shielding structures. The shielding effectiveness data is summarized in Table 4.

TABLE 4

| Sample | Areal Weight (g/m²) | Shielding Effectiveness at 4 GHz (dB) | Normalized Performance (Shielding Effectiveness/Areal Weight-dB · m²/g) |
|---|---|---|---|
| Spray-Coated CNTs | 0.8 | 27 | 33.75 |
| CNS-Coated Carbon Fiber Veil | 15 | 40 | 2.67 |
| Nanocomp Carbon Nanotube Sheet (1 Layer) | 19 | 44 | 2.32 |
| Buckypaper | 35 | 58 | 1.66 |
| Nanocomp Carbon Nanotube Sheet (2 Layers) | 40 | 52 | 1.30 |
| Cu/Ni Polyester Veil (MTC) | 68 | 68 | 1.00 |
| Ni/Ag Nylon Tafetta (STM) | 78 | 60 | 0.77 |
| Ag Nylon Loop (STM) | 125.5 | 60 | 0.48 |
| GRAF-X | 538.2 | 70 | 0.13 |
| AMBERSTRAND | 585 | 40 | 0.07 |
| Metallic Over-Braid | 3500 | 50 | 0.01 |

As shown in Table 4, the normalized performance of the carbon nanostructured-coated fiber veil was greater than that seen for all tested materials, except for spray-coated carbon nanotubes.

Example 3

Figure 11:
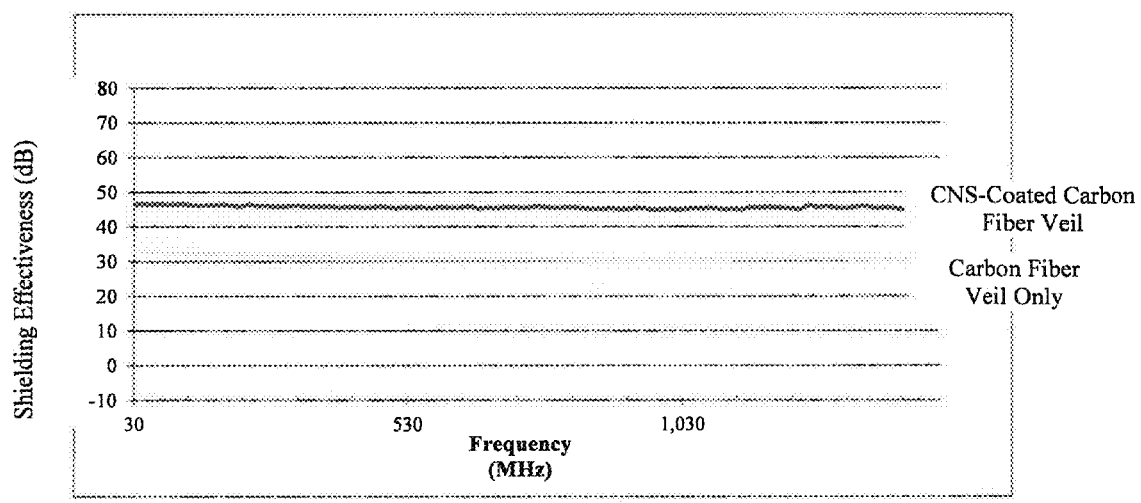
FIG. 11 shows an illustrative plot of shielding effectiveness in dB as a function of electromagnetic radiation frequency for a carbon nanostructure-coated carbon fiber veil and a comparable uncoated veil.

Shielding Effectiveness of Carbon Nanostructure-Coated Carbon Fiber Veils as a Function of Electromagnetic Radiation Frequency FIG. 11 shows an illustrative plot of shielding effectiveness in dB as a function of electromagnetic radiation frequency for a carbon nanostructure-coated carbon fiber veil and a comparable uncoated veil. As shown in FIG. 11, approximately a 15 dB increase in shielding effectiveness was realized by coating the fiber veil. For the data shown in FIG. 11, the fiber veil was a Ni,Cu/carbon fiber veil having an areal weight of 10 g/m², and the coated fiber veil had 5 g/m² of carbon nanostructures applied thereto. Testing was conducted according to ASTM 4935.

Example 4

Figure 12:
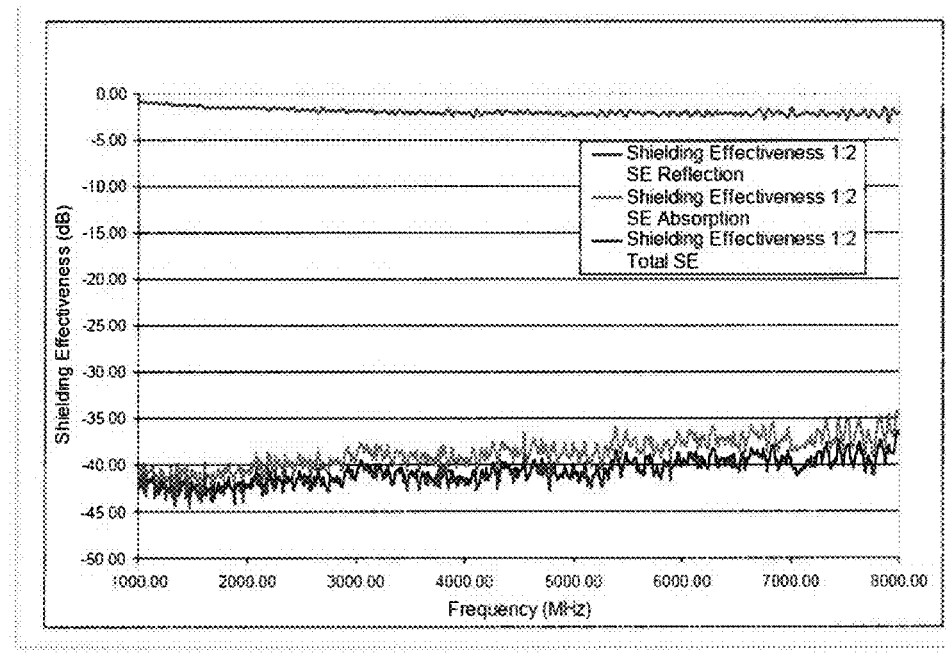
FIGS. 12 and 13 show illustrative plots of shielding effectiveness in dB as a function of electromagnetic radiation frequency for a carbon nanostructure-coated carbon fiber veil.
Figure 13:
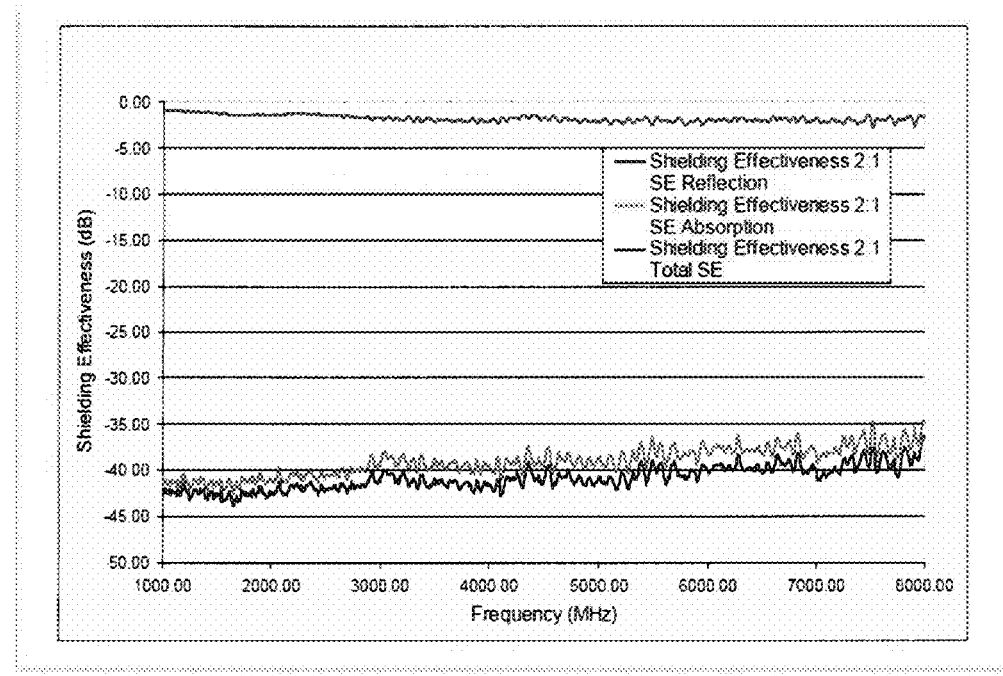

Shielding Effectiveness of Carbon Nanostructure-Coated Carbon Fiber Veils as a Function of Electromagnetic Radiation Frequency at Different Carbon Nanostructure Loadings Carbon fiber veils were prepared with a 1:2 and a 2:1 loading of carbon nanostructures relative to the carbon fiber veil. FIGS. 12 and 13 show illustrative plots of shielding effectiveness in dB as a function of electromagnetic radiation frequency for a carbon nanostructure-coated carbon fiber veil. FIG. 12 shows the data for a carbon fiber veil containing a 1:2 ratio of carbon nanostructures to carbon fibers, and FIG. 13 shows the data for a carbon fiber veil containing a 2:1 ratio of carbon nanostructures to carbon fibers. In both cases, very high total shielding effectiveness was observed.

Example 5

Figure 14:
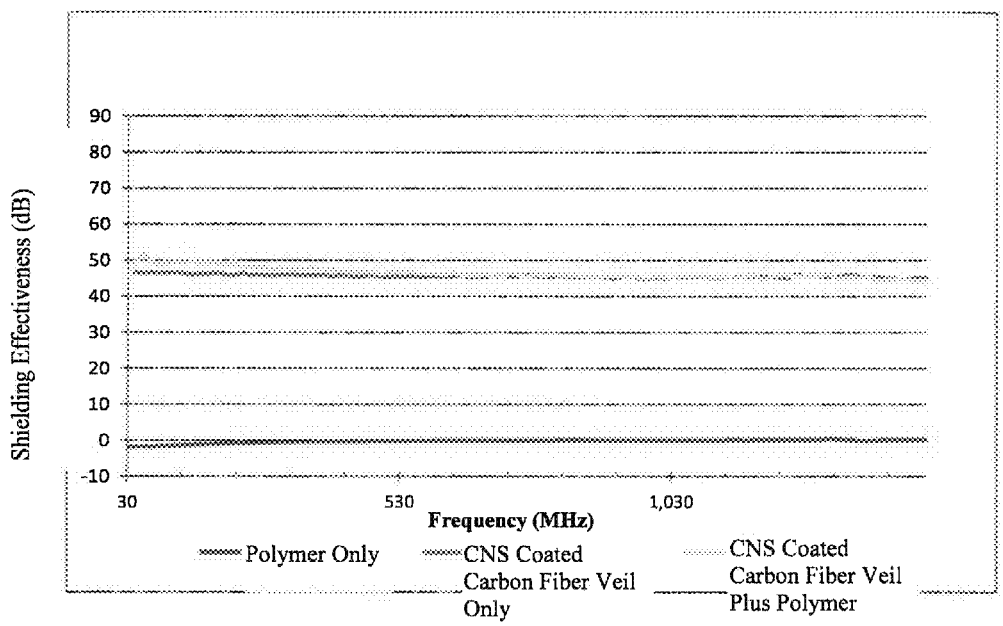
FIG. 14 shows an illustrative plot of shielding effectiveness as a function of electromagnetic radiation frequency for a carbon nanostructure-coated carbon fiber veil before and after application to a polymer substrate.

Shielding Effectiveness of a Carbon Nanostructure-Coated Carbon Fiber Veil on a Polymer Substrate as a Function of Electromagnetic Radiation Frequency An illustrative carbon nanostructure-coated carbon fiber veil was prepared and applied to a polymer substrate. The shielding effectiveness was evaluated as a function of electromagnetic radiation frequency both before and after application to the polymer substrate and also compared to the shielding effectiveness for the polymer substrate alone. FIG. 14 shows an illustrative plot of shielding effectiveness as a function of electromagnetic radiation frequency for a carbon nanostructure-coated carbon fiber veil before and after application to a polymer substrate. Comparative data for the polymer substrate alone is also provided. As shown in FIG. 14, the carbon nanostructure-coated substrate had approximately the same shielding effectiveness both before and after application to the polymer substrate. The polymer substrate, in contrast, had a very low shielding effectiveness. Thus, by applying a carbon nanostructure-coated fiber veil to a substrate, electromagnetic radiation protection characteristics can be effectively conveyed thereto.

Figure 15:
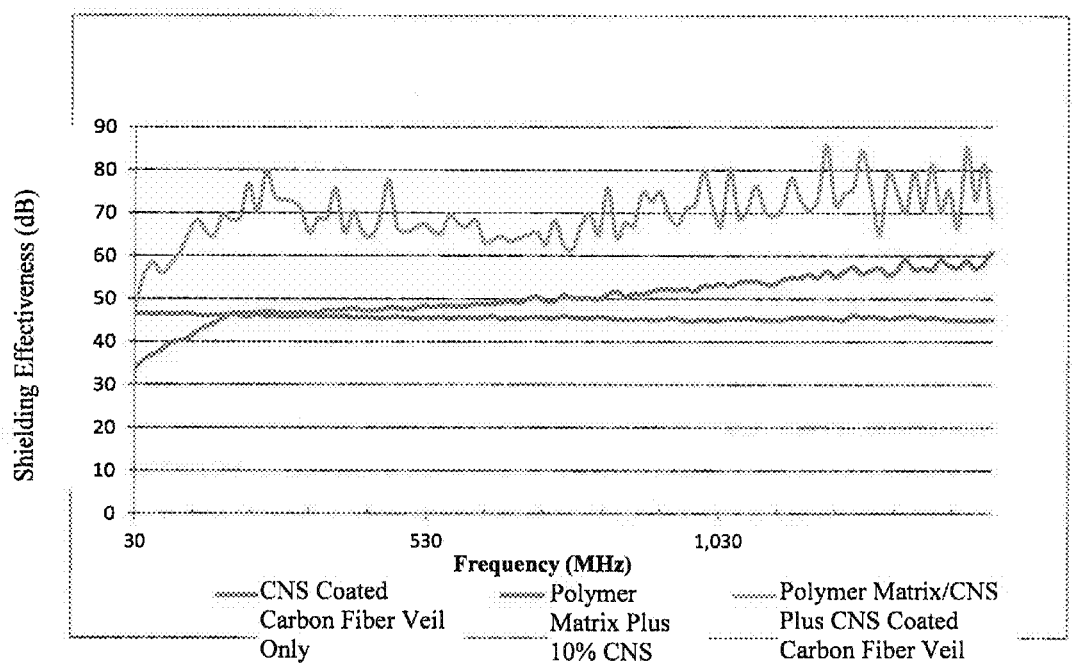
FIG. 15 shows an illustrative plot of shielding effectiveness as a function of electromagnetic radiation frequency for a carbon nanostructure-coated carbon fiber veil before and after its combination with a polymer substrate also containing 10% carbon nanostructures.

The carbon nanostructure-coated fiber veils can also be combined with polymer matrices containing dispersed carbon nanostructures to achieve similar effects. FIG. 15 shows an illustrative plot of shielding effectiveness as a function of electromagnetic radiation frequency for a carbon nanostructure-coated carbon fiber veil before and after its combination with a polymer substrate also containing 10% carbon nanostructures. As shown in FIG. 15, both the carbon nanostructure-coated carbon fiber veil and the polymer matrix individually provided shielding effectiveness in this case. When the two were combined, an even greater shielding effectiveness was observed.

Example 6

Figure 16:
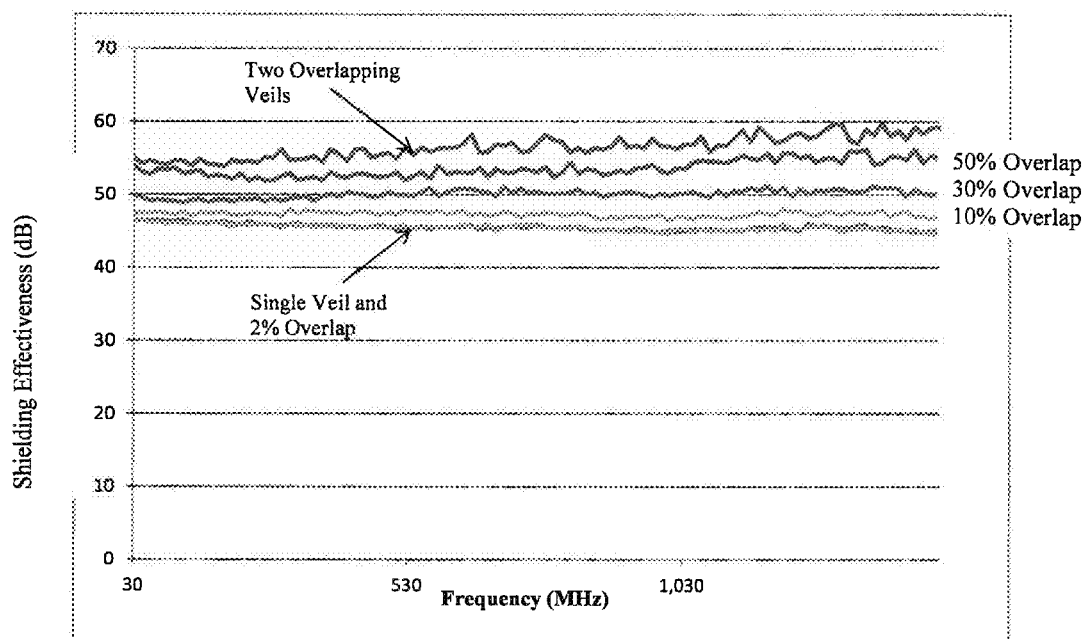
FIG. 16 shows an illustrative plot of shielding effectiveness for two carbon nanostructure-coated carbon fiber veils with varying degrees of overlap.

Leakage Around the Seam of Overlapping Carbon Nanostructure-coated Carbon Fiber Veils To determine the behavior of the material where there is a seam (e.g., when wrapping a cable or at the corner of an enclosure), two carbon nanostructure-coated carbon fiber veils were fully overlapped and then gradually cut back. FIG. 16 shows an illustrative plot of shielding effectiveness for two carbon nanostructure-coated carbon fiber veils with varying degrees of overlap. As shown in FIG. 16, at as little as 2% overlap, the shielding effectiveness was not significantly different than that of a single carbon nanostructure layer. At greater degrees of overlap, the shielding effectiveness was increased.

Although the invention has been described with reference to the disclosed embodiments, one skilled in the art will readily appreciate that these are only illustrative of the invention. It should be understood that various modifications can be made without departing from the spirit of the invention. The invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

What is claimed is the following:

1. An electrically conductive structure comprising:
   a support layer comprising a plurality of fibers configured as a fiber mat and having apertures defined between the fibers; and
   a plurality of carbon nanostructures at least partially conformally coating the fibers;
      wherein the carbon nanostructures are in the form of a carbon nanostructure flake material and are free of a growth substrate adhered to the carbon nanostructures;
      wherein the carbon nanostructure flake material bridges across the apertures defined between adjacent fibers to form a continuous carbon nanostructure layer; and
   wherein each carbon nanostructure comprises a plurality of carbon nanotubes that are branched, crosslinked, and share common walls with one another.

2. The electrically conductive structure of claim 1, wherein the fibers comprise carbon fibers, glass fibers, or any combination thereof.

3. The electrically conductive structure of claim 1, wherein the fibers are coated with a metallization layer.

4. The electrically conductive structure of claim 3, wherein the metallization layer comprises a metal selected from the group consisting of nickel, copper, and any combination thereof.

5. The electrically conductive structure of claim 1, wherein the plurality of fibers in the support layer are oriented randomly with respect to one another.

6. The electrically conductive structure of claim 1, wherein the carbon nanotubes in each carbon nanostructure are formed with branching, crosslinking, and sharing common walls with one another during formation of the carbon nanostructures on a growth substrate.

7. The electrically conductive structure of claim 1, wherein the electrically conductive structure is substantially planar.

8. The electrically conductive structure of claim 1, wherein the electrically conductive structure is substantially cylindrical.

9. The electrically conductive structure of claim 1, wherein the plurality of fibers comprise a plurality of carbon nanostructure-infused fibers having carbon nanostructures grown from a surface of a fiber material.

10. The electrically conductive structure of claim 1, further comprising:
- a surface to which the electrically conductive structure is applied.

11. The electrically conductive structure of claim 1, wherein the electrically conductive structure exhibits shielding against electromagnetic radiation over a frequency range between at least about 30 MHz to about 8 GHz.

* * * * *